(12) United States Patent  
Ding

(10) Patent No.: US 7,190,019 B2  
(45) Date of Patent: Mar. 13, 2007

(54) INTEGRATED CIRCUITS WITH OPENINGS THAT ALLOW ELECTRICAL CONTACT TO CONDUCTIVE FEATURES HAVING SELF-ALIGNED EDGES

(75) Inventor: Yi Ding, Sunnyvale, CA (US)

(73) Assignee: ProMOS Technologies Inc., Hsin-Chu (TW)

( * ) Notice: Subject to any disclaimer, the term of this patent is extended or adjusted under 35 U.S.C. 154(b) by 0 days.

(21) Appl. No.: 11/013,593

(22) Filed: Dec. 14, 2004

(65) Prior Publication Data

US 2005/0095849 A1 May 5, 2005

Related U.S. Application Data

(62) Division of application No. 10/440,500, filed on May 16, 2003.

(51) Int. Cl.
*H01L 29/787* (2006.01)
*H01L 29/788* (2006.01)
*H01L 29/336* (2006.01)

(52) U.S. Cl. .............................. 257/315; 257/E21.693; 257/E27.103; 438/259; 438/267; 438/270

(58) Field of Classification Search ........ 257/E21.693, 257/E27.103, 315; 438/259, 267, 270
See application file for complete search history.

(56) References Cited

U.S. PATENT DOCUMENTS

| 4,701,776 | A | 10/1987 | Perlegos et al. |
| 5,402,371 | A | 3/1995 | Ono |
| 5,408,115 | A | 4/1995 | Chang |
| 5,424,979 | A | 6/1995 | Morii |
| 5,445,983 | A | 8/1995 | Hong |
| 5,633,185 | A | 5/1997 | Yiu et al. |
| 5,668,757 | A | 9/1997 | Jeng |
| 5,705,415 | A | * 1/1998 | Orlowski et al. ........... 438/259 |
| 5,821,143 | A | 10/1998 | Kim et al. |
| 5,856,943 | A | 1/1999 | Jenq |
| 5,901,084 | A | 5/1999 | Ohnakado |
| 5,910,912 | A | 6/1999 | Hsu et al. |

(Continued)

FOREIGN PATENT DOCUMENTS

EP    0 938 098 A2    8/1999

OTHER PUBLICATIONS

Shirota, Riichiro " A Review of 256Mbit NAND Flash Memories and NAND Flash Future Trend," Feb. 2000, Nonvolatile Memory Workshop in Monterey, California, pp. 22-31.

(Continued)

*Primary Examiner*—Long Pham
*Assistant Examiner*—Shrinivas H. Rao
(74) *Attorney, Agent, or Firm*—Michael Shenker; MacPherson Kwok Chen & Heid LLP

(57) ABSTRACT

A widened contact area (170X) of a conductive feature (170) is formed by means of self-alignment between an edge (170E2) of the conductive feature and an edge (140E) of another feature (140). The other feature ("first feature") is formed from a first layer, and the conductive feature is formed from a second layer overlying the first layer. The edge (170E2) of the conductive feature is shaped to provide a widened contact area. This shaping is achieved in a self-aligned manner by shaping the corresponding edge (140E) of the first feature.

24 Claims, 25 Drawing Sheets

U.S. PATENT DOCUMENTS

| | | | |
|---|---|---|---|
| 5,912,843 | A | 6/1999 | Jeng |
| 5,918,124 | A | 6/1999 | Sung |
| 6,011,725 | A | 1/2000 | Eitan |
| 6,040,216 | A | 3/2000 | Sung |
| 6,057,575 | A | 5/2000 | Jenq |
| 6,107,141 | A | 8/2000 | Hsu et al. |
| 6,130,129 | A | 10/2000 | Chen |
| 6,133,098 | A | 10/2000 | Ogura et al. |
| 6,134,144 | A | 10/2000 | Lin et al. |
| 6,162,682 | A | 12/2000 | Kleine |
| 6,171,909 | B1 | 1/2001 | Ding et al. |
| 6,187,636 | B1 | 2/2001 | Jeong |
| 6,200,856 | B1 | 3/2001 | Chen |
| 6,214,669 | B1 | 4/2001 | Hisamune |
| 6,218,689 | B1 | 4/2001 | Chang et al. |
| 6,228,695 | B1 | 5/2001 | Hsieh et al. |
| 6,232,185 | B1 | 5/2001 | Wang |
| 6,261,843 | B1 | 7/2001 | Chang et al. |
| 6,265,739 | B1 | 7/2001 | Yaegashi et al. |
| 6,266,278 | B1 | 7/2001 | Harari et al. |
| 6,291,297 | B1 | 9/2001 | Chen |
| 6,326,661 | B1 | 12/2001 | Dormans et al. |
| 6,344,993 | B1 | 2/2002 | Harari et al. |
| 6,355,524 | B1 | 3/2002 | Tuan et al. |
| 6,365,457 | B1 | 4/2002 | Choi |
| 6,388,293 | B1 | 5/2002 | Ogura et al. |
| 6,414,872 | B1 | 7/2002 | Bergemont et al. |
| 6,420,231 | B1 | 7/2002 | Harari et al. |
| 6,436,764 | B1 | 8/2002 | Hsieh |
| 6,437,360 | B1 | 8/2002 | Cho et al. |
| 6,438,036 | B2 | 8/2002 | Seki et al. |
| 6,468,865 | B1 | 10/2002 | Yang et al. |
| 6,486,023 | B1 | 11/2002 | Nagata |
| 6,518,618 | B1 | 2/2003 | Fazio et al. |
| 6,541,324 | B1 | 4/2003 | Wang |
| 6,541,829 | B2 | 4/2003 | Nishinohara et al. |
| 6,566,196 | B1 | 5/2003 | Haselden et al. |
| 6,635,533 | B1 | 10/2003 | Chang et al. |
| 6,642,103 | B2 | 11/2003 | Wils et al. |
| 6,660,589 | B2 | 12/2003 | Park |
| 6,696,340 | B2 | 2/2004 | Furuhata |
| 6,747,310 | B2 | 6/2004 | Fan et al. |
| 6,764,905 | B2 | 7/2004 | Jeng et al. |
| 6,803,276 | B2 | 10/2004 | Kim et al. |
| 2002/0064071 | A1 | 5/2002 | Takahashi et al. |
| 2002/0197888 | A1 | 12/2002 | Huang et al. |
| 2003/0205776 | A1 | 11/2003 | Yaegashi et al. |

OTHER PUBLICATIONS

Naruke, K.; Yamada, S.; Obi, E.; Taguchi, S.; and Wada, M. "A New Flash-Erase EEPROM Cell with A Sidewall Select-Gate On Its Source Side," 1989 IEEE, pp. 604-606.

Wu, A.T.; Chan T.Y.; Ko, P.K.; and Hu, C. "A Novel High-Speed, 5-Volt Programming EPROM Structure With Source-Side Injection," 1986 IEEE, 584-587.

Mizutani, Yoshihisa; and Makita, Koji "A New EPROM Cell With A Sidewall Floating Gate Fro High-Density and High Performance Device," 1985 IEEE, 635-638.

Ma, Y.; Pang, C.S.; Pathak, J.; Tsao, S.C.; Chang, C.F.; Yamauchi, Y.; Yoshimi, M. "A Novel High Density Contactless Flash Memory Array Using Split-Gate Source-Side-Injection Cell for 5V-Only Applications," 1994 Symposium on VLSI Technology Digest of Technical Papers, pp. 49-50.

Mih, Rebecca et al. "0.18um Modular Triple Self-Aligned Embedded Split-Gate Flash Memory," 2000 Symposium on VLSI Technology Digest of Technical Papers, pp. 120-121.

Ma, Yale et al., "A Dual-Bit Split-Gate EEPROM (DSG) Cell in Contactless Array for Single Vcc High Density Flash Memories," 1994 IEEE, 3.5.1-3.5.4.

Spinelli, Alessandro S., "Quantum-Mechanical 2D Simulation of Surface-and Buried-Channel p-MOS,"2000 International Conference on Simulation of Semiconductor Processes and Devices: SISPAD 2000, Seattle, WA Sep. 6-8, 2000.

Kim, K.S. et al. " A Novel Dual String NOR (DuSnor) Memory Cell Technolgy Scalabe to the 256 Mbit and 1 Gbit Flash Memories," 1995 IEEE 11.1.1-11.1.4.

Bergemont, A. et al."NOR Virtual Ground (NVG)- A New Scaling Concept for Very High Density FLAS EEPROM and its Implementation in a 0.5 um Process," 1993 IEEE 2.2.1-2.2.4.

Van Duuren, Michiel et al., "Compact poly-CMP Embedded Flash Memory Cells For One or Two Bit Storage," Philips Research Leuven, Kapeldreef 75, B3001 Leuven, Belgium, pp. 73-74.

U.S. Appl. No. 10/440,466, entitled "Fabrication Of Conductive Gates For Nonvolatile Memories From Layers With Protruding Portions," filed May 16, 2003.

U.S. Appl. No. 10/440,005, entitled "Fabrication of Dielectric On A Gate Surface To Insulate The Gate From Another Element Of An Integrated Circuit," filed May 16, 2003.

U.S. Appl. No. 10/440,508, entitled "Fabrication Of Gate Dielectric In Nonvolatile Memories Having Select, Floating And Control Gates," filed May 16, 2003.

U.S. Appl. No. 10/440,500, entitled "Integrated Circuits With Openings that Allow Electrical Contact To Conductive Features Having Self-Aligned Edges," filed May 16, 2003.

U.S. Appl. No. 10/393,212, entitled "Nonvolatile Memories And Methods Of Fabrication," filed Mar. 19, 2003.

U.S. Appl. No. 10/411,813, entitled "Nonvolatile Memories With A Floating Gate Having An Upward Protrusion," filed Apr. 10, 2003.

U.S. Appl. No. 10/393,202, entitled "Fabrication of Integrated Circuit Elements In Structures With Protruding Features," filed Mar. 19, 2003.

U.S. Appl. No. 10/631,941, entitled "Nonvolatile Memory Cell With Multiple Floating Gates Formed After The Select Gate," filed Jul. 30, 2003.

U.S. Appl. No. 10/632,155, entitled "Nonvolatile Memory Cells With Buried Channel Transistors," filed Jul. 30, 2003.

U.S. Appl. No. 10/632,007, entitled "Arrays Of Nonvolatile Memory Cells Wherin Each Cell Has Two Conductive Floating Gates," filed Jul. 30, 2003.

U.S. Appl. No. 10/631,452, entitled "Fabrication Of Dielectric For A Nonvolatile Memory Cell Having Multiple Floating Gates," filed Jul. 30, 2003.

U.S. Appl. No. 10/632,154, entitled "Fabrication Of Gate Dielectric In Nonvolatile Memories In Which A Memory Cell Has Multiple Floating Gates," filed Jul. 30, 2003.

U.S. Appl. No. 10/632,186, entitled "Nonvolatile Memory Cell With Multiple Floating Gates Formed After The Select Gate And Having Upward Protrusions," filed Jul. 30, 2003.

U.S. Appl. No. 10/631,552, entitled "Nonvolatile Memories And Methods Of Fabrication," filed Jul. 30, 2003.

* cited by examiner

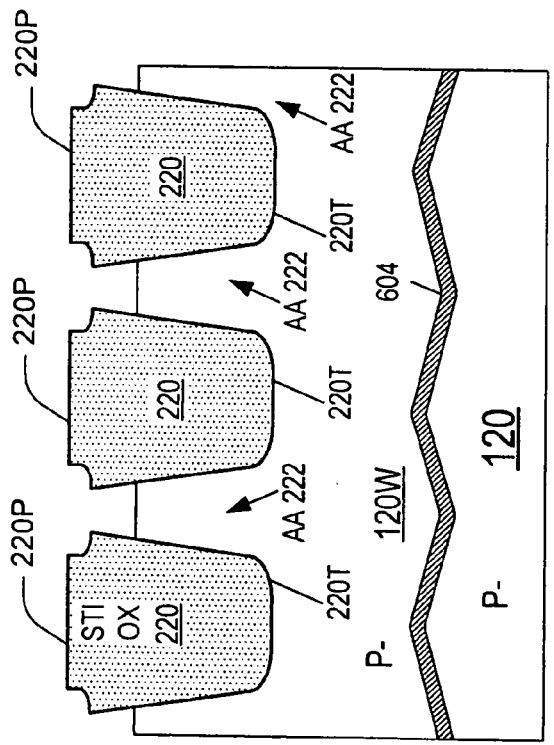
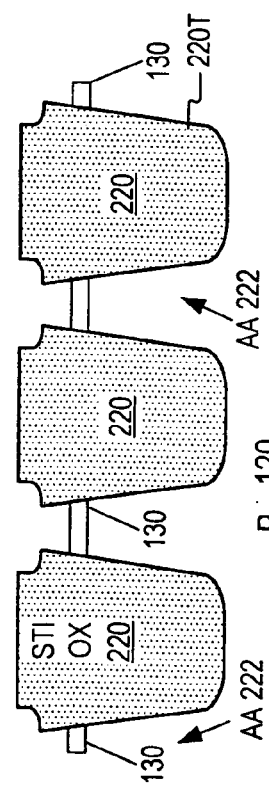
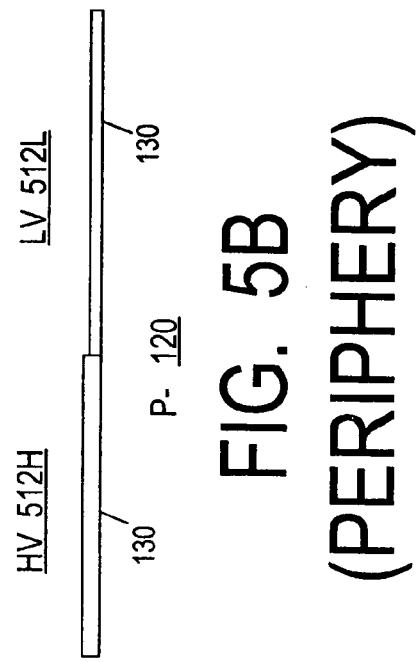

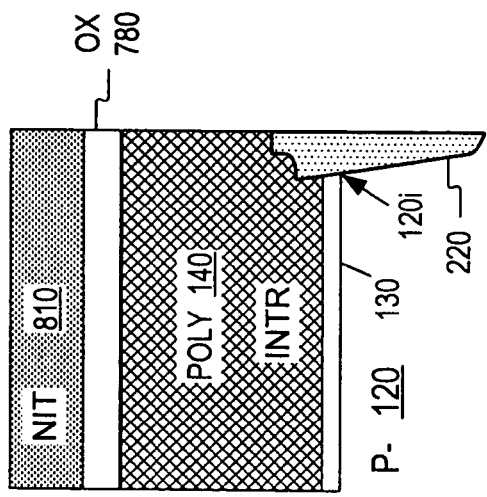
FIG. 6B (PERIPHERY)
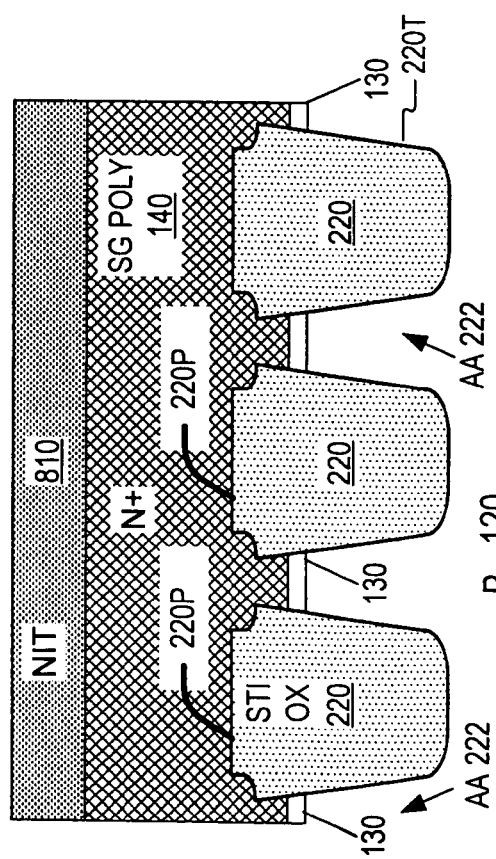
FIG. 6A (Y1-Y1')

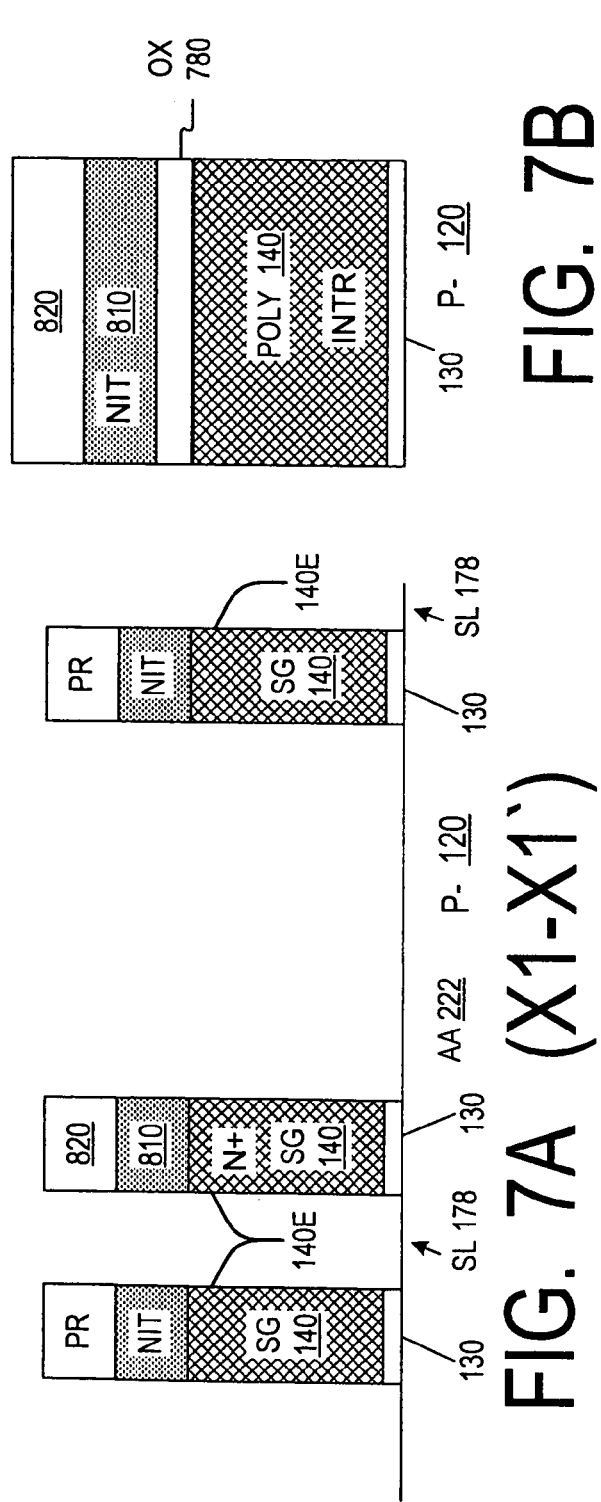

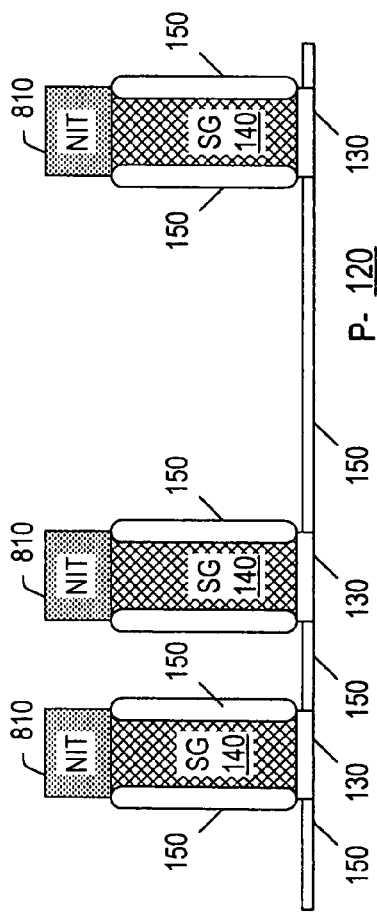
FIG. 8 (X1-X1')
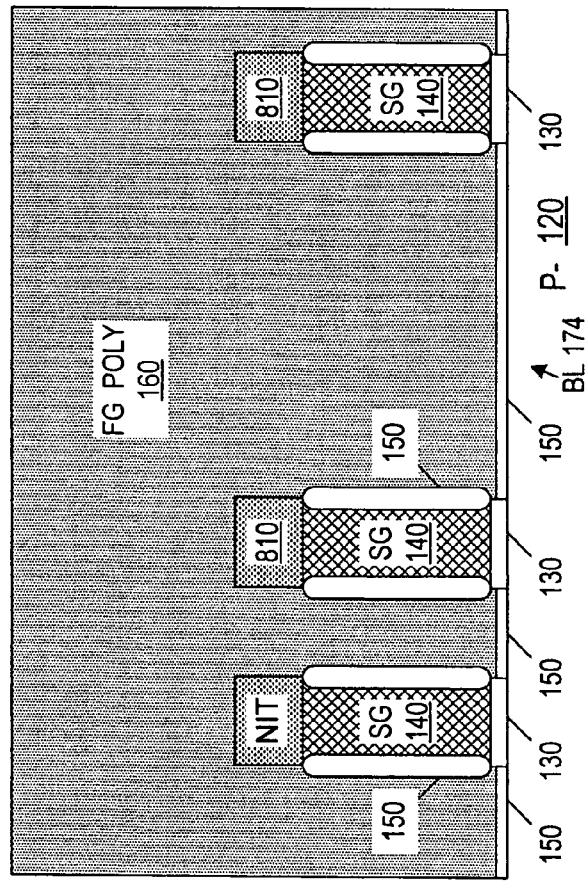
FIG. 9 (X1-X1')

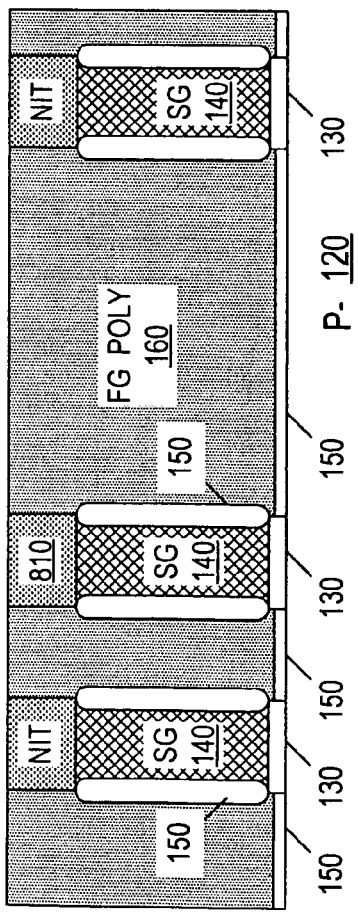
FIG. 10 (X1-X1')
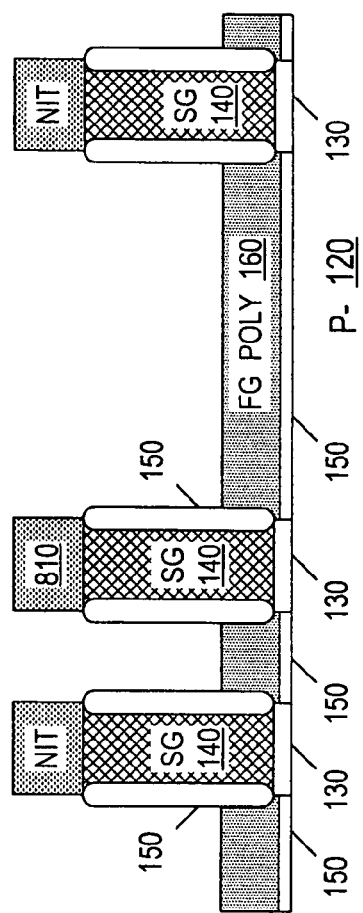
FIG. 11A (X1-X1')
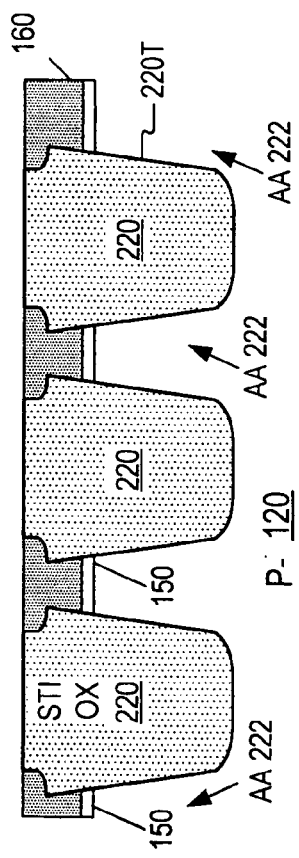
FIG. 11B (Y2-Y2')

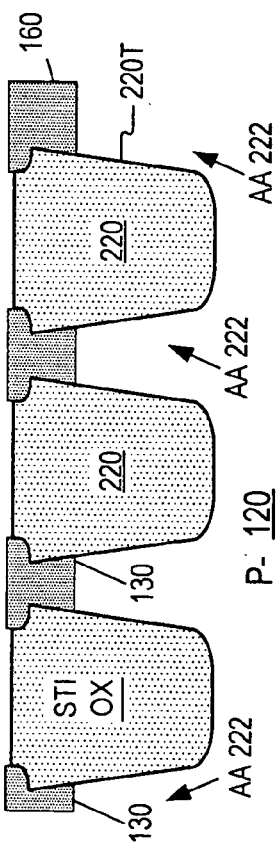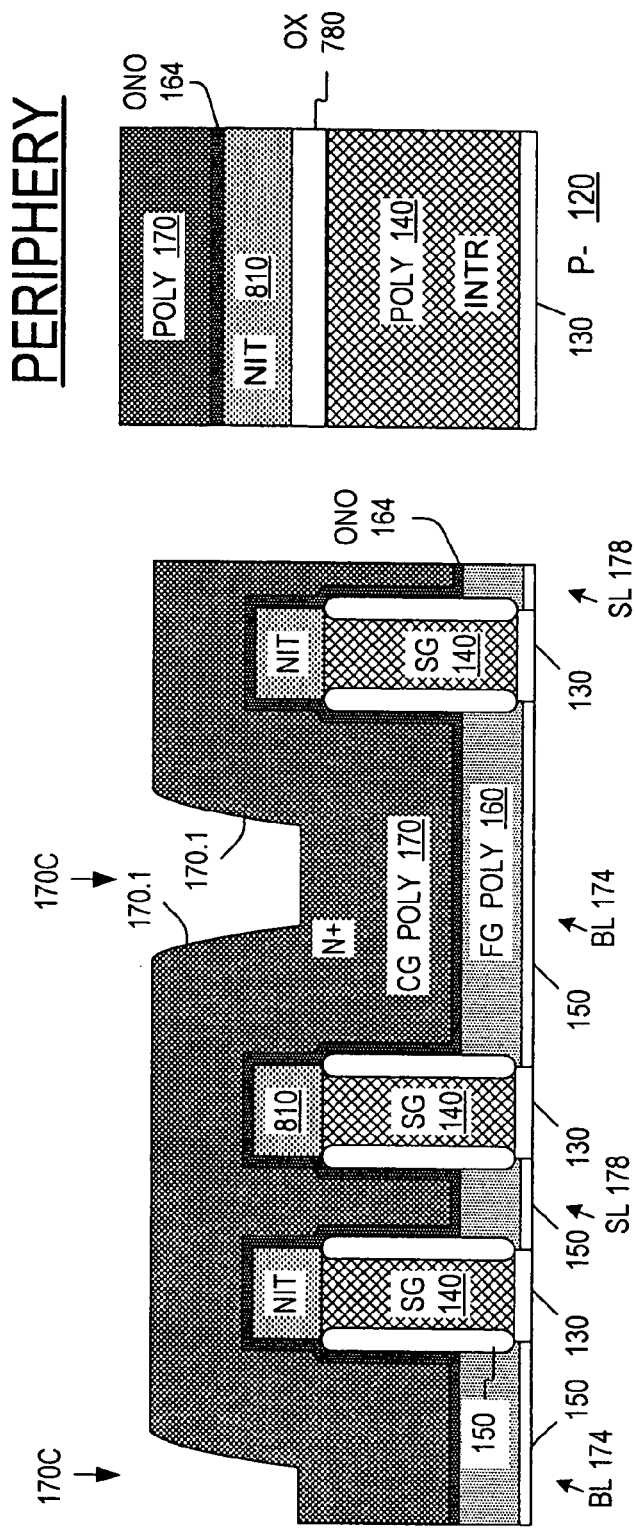

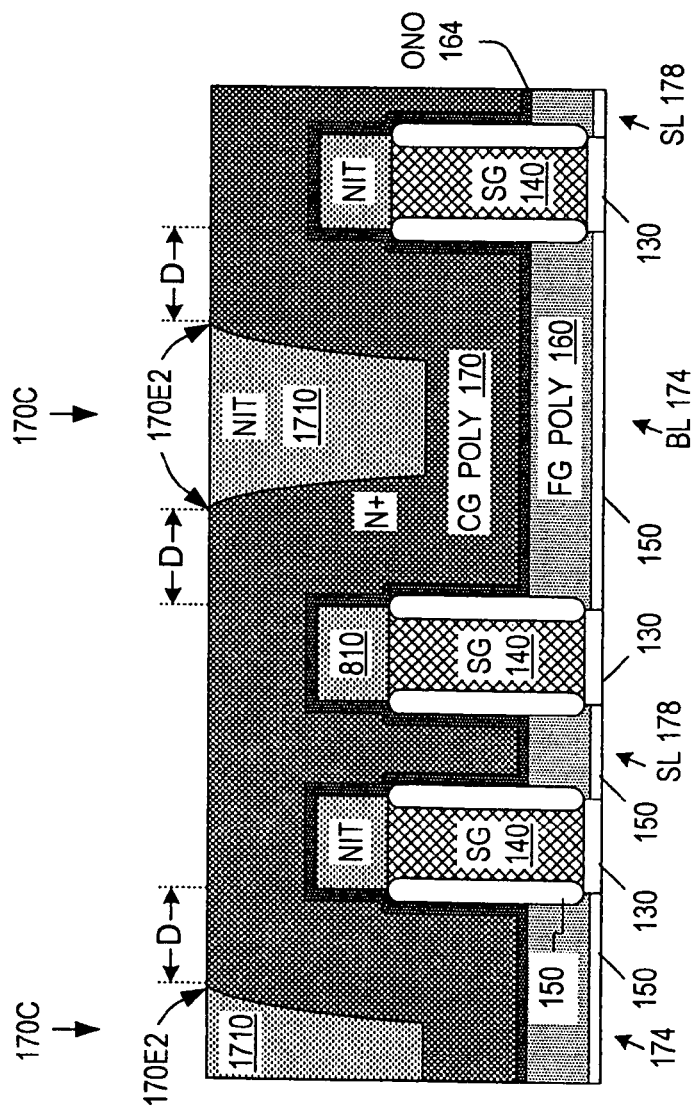
FIG. 14 (X1-X1')

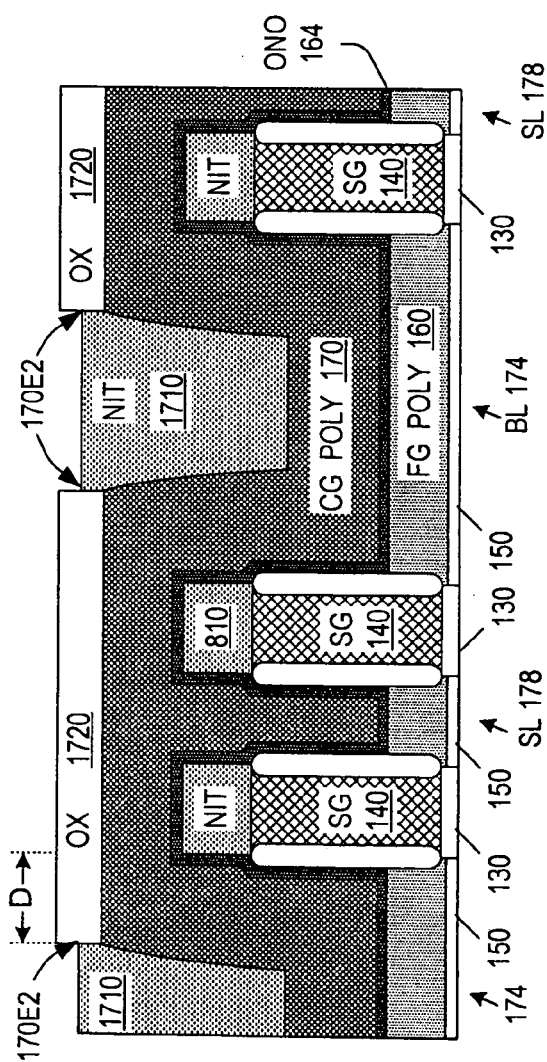
FIG. 15A (X1-X1')
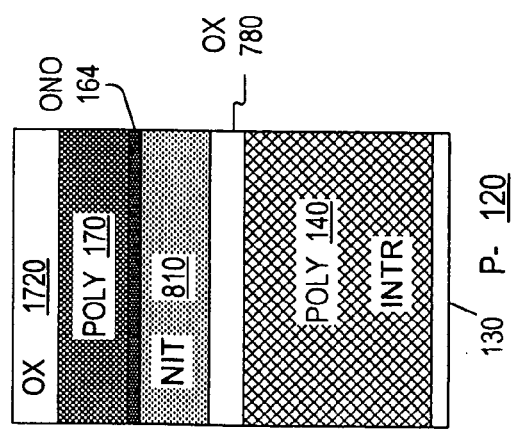
FIG. 15B (PERIPHERY)

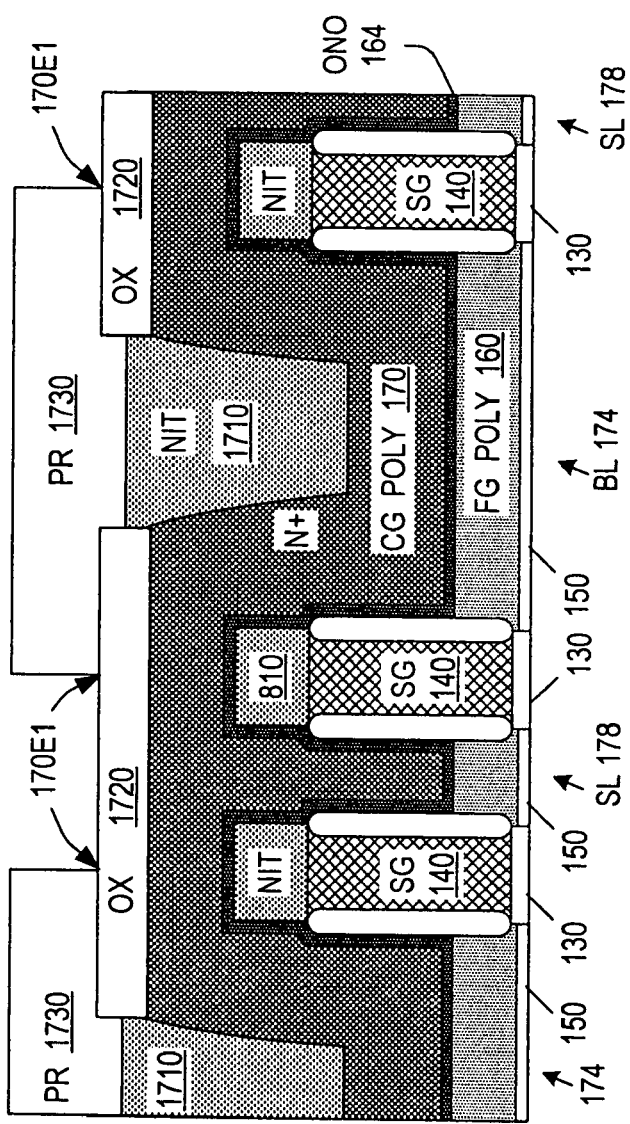
FIG. 16 (X1-X1')

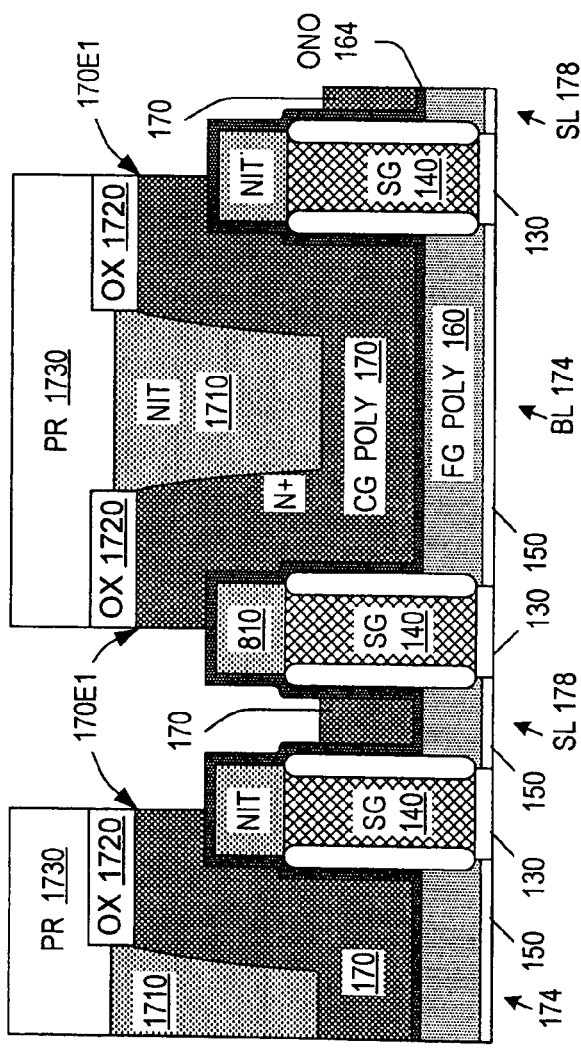
FIG. 17A (X1-X1')
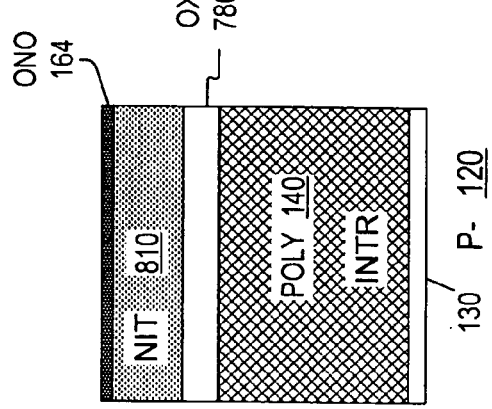
FIG. 17B (PERIPHERY)

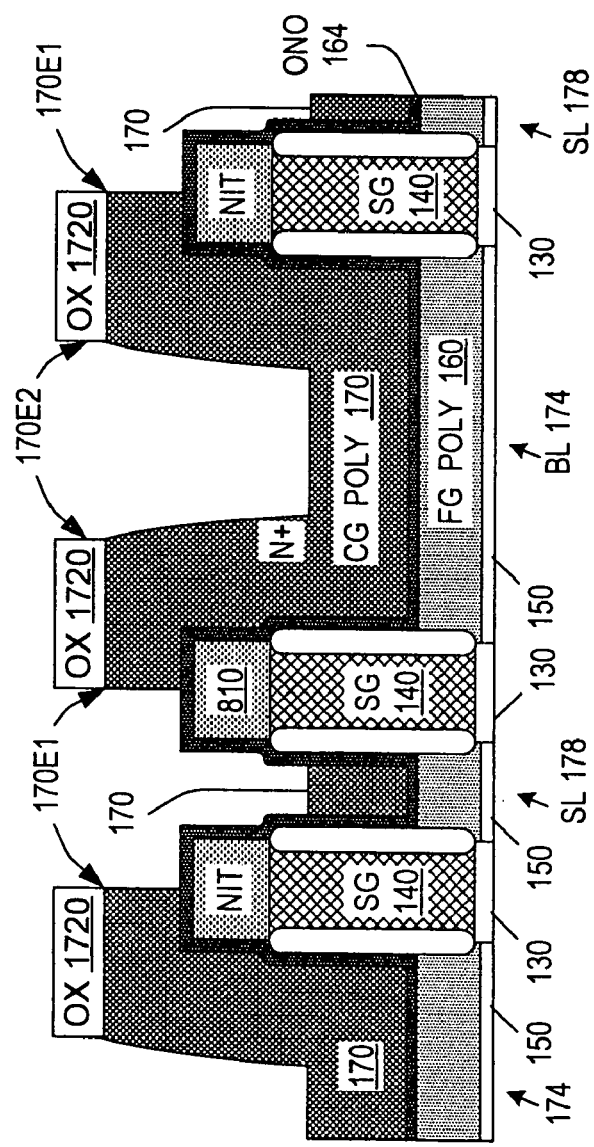
FIG. 18 (X1-X1')

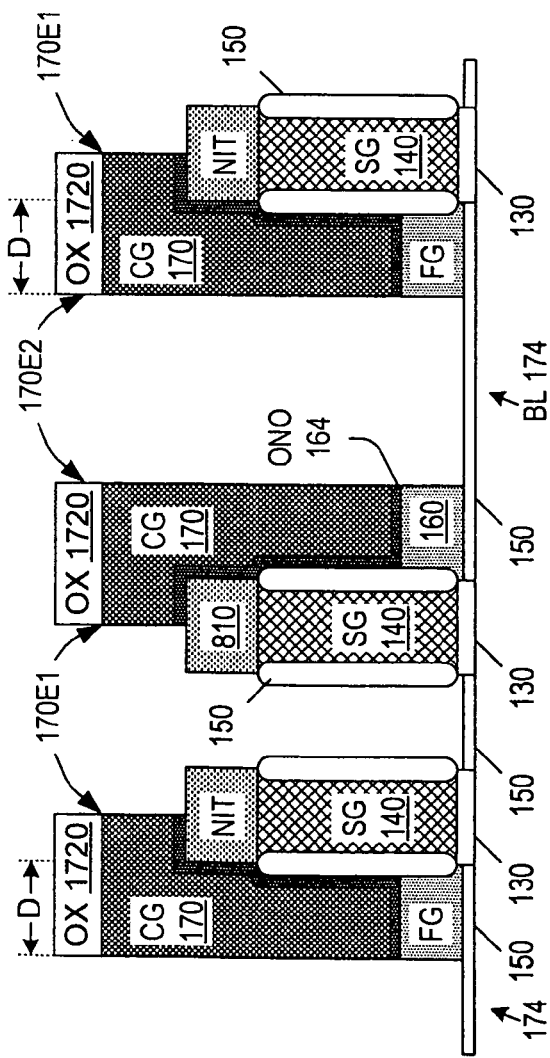
FIG. 19A (X1-X1')
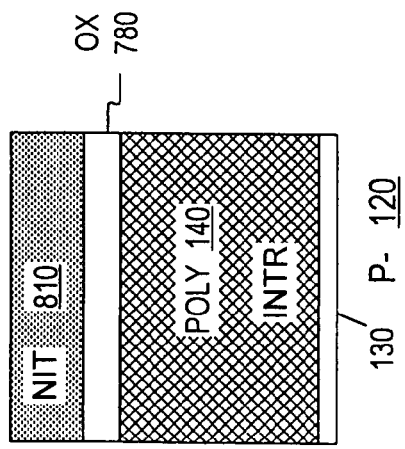
FIG. 19B (PERIPHERY)

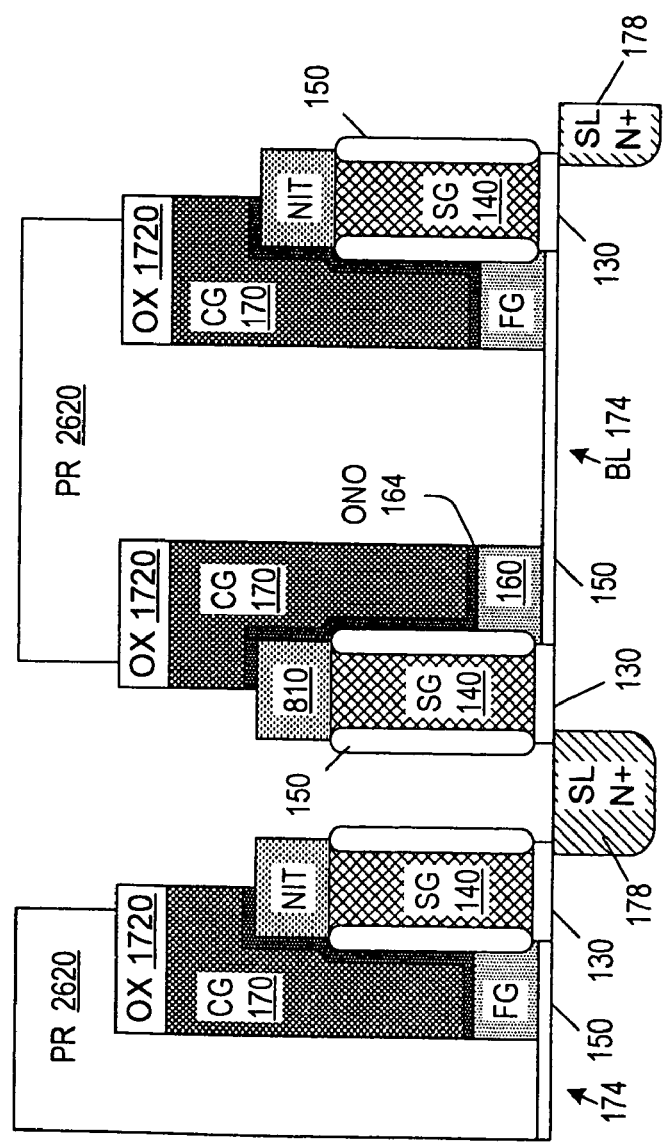
FIG. 20A (X1-X1')

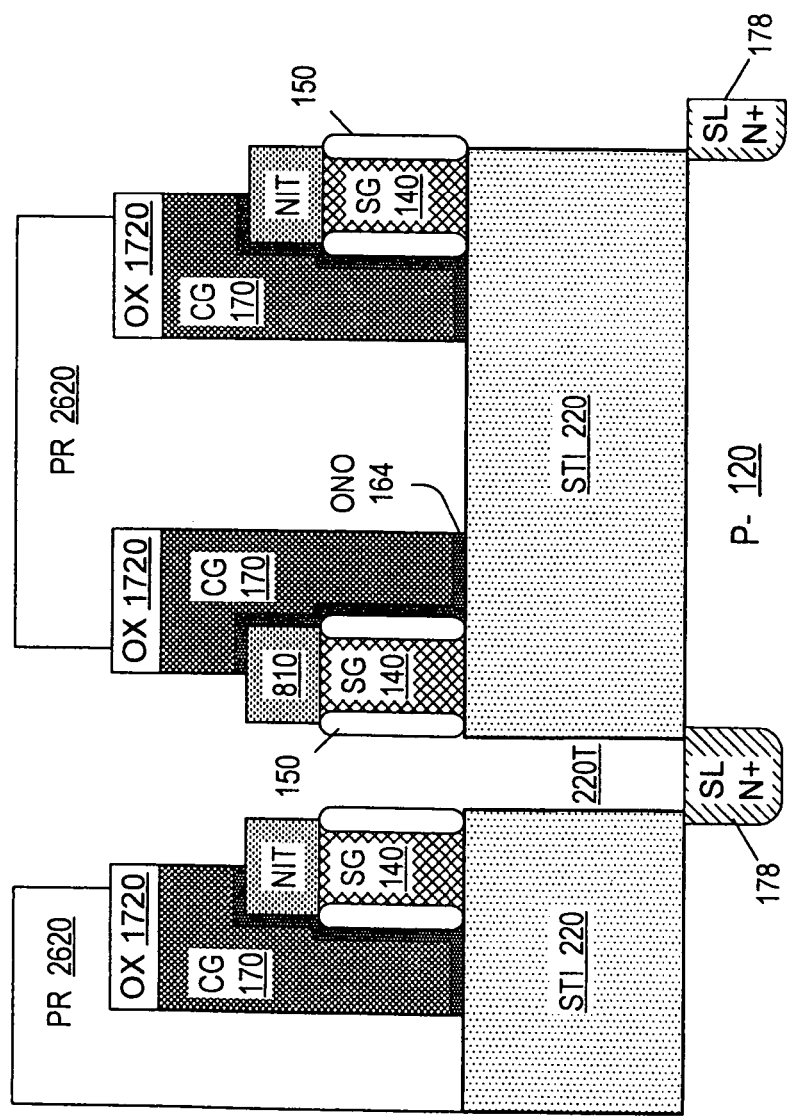
FIG. 20B (X2-X2')

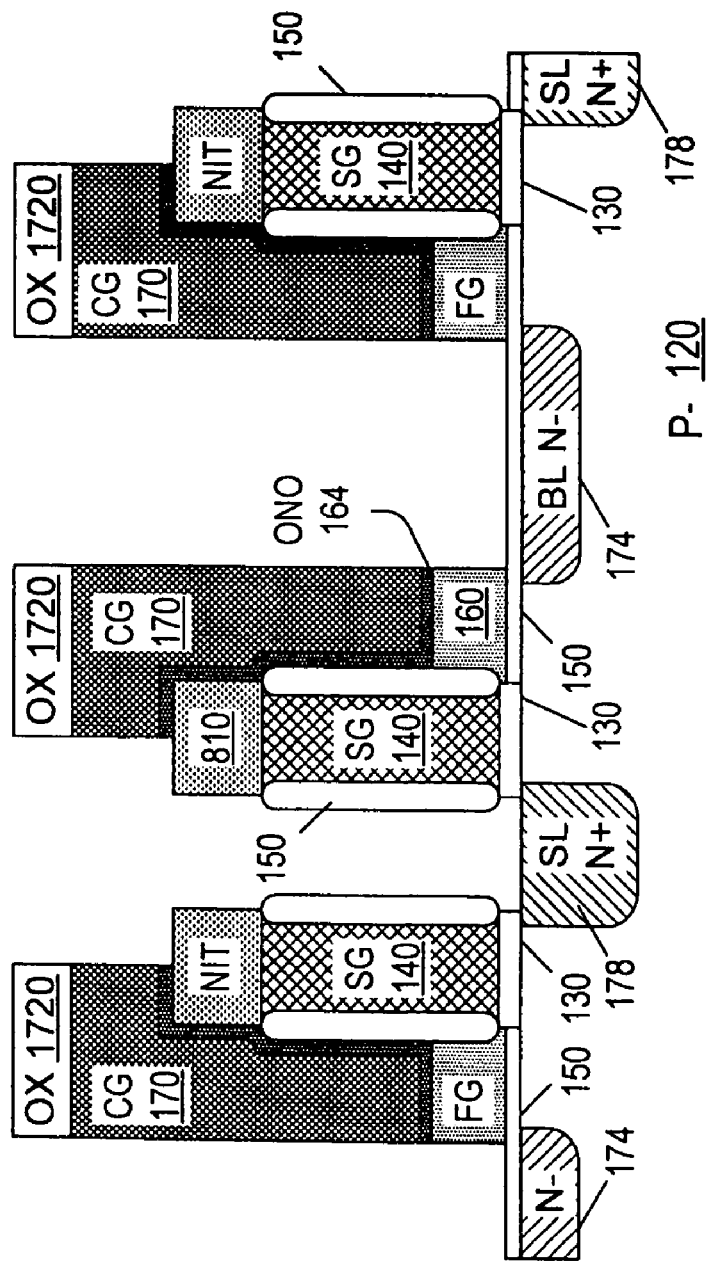
FIG. 21A (X1-X1')

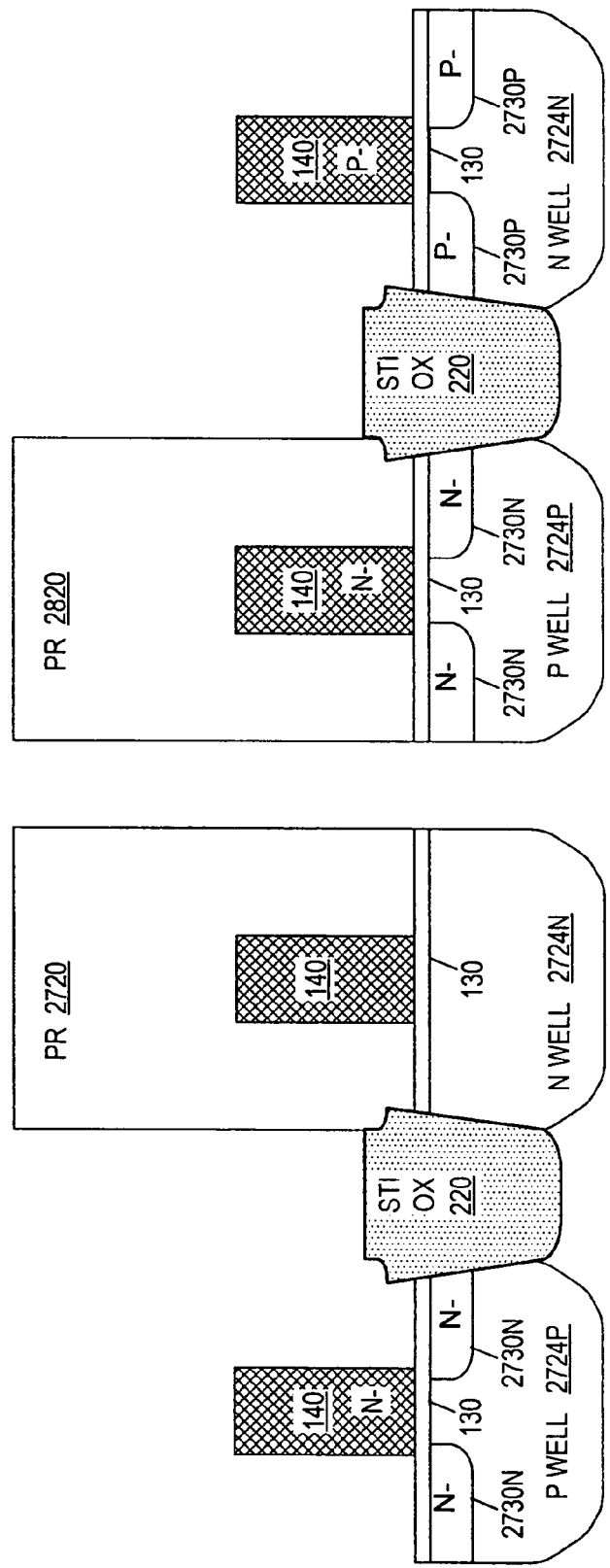

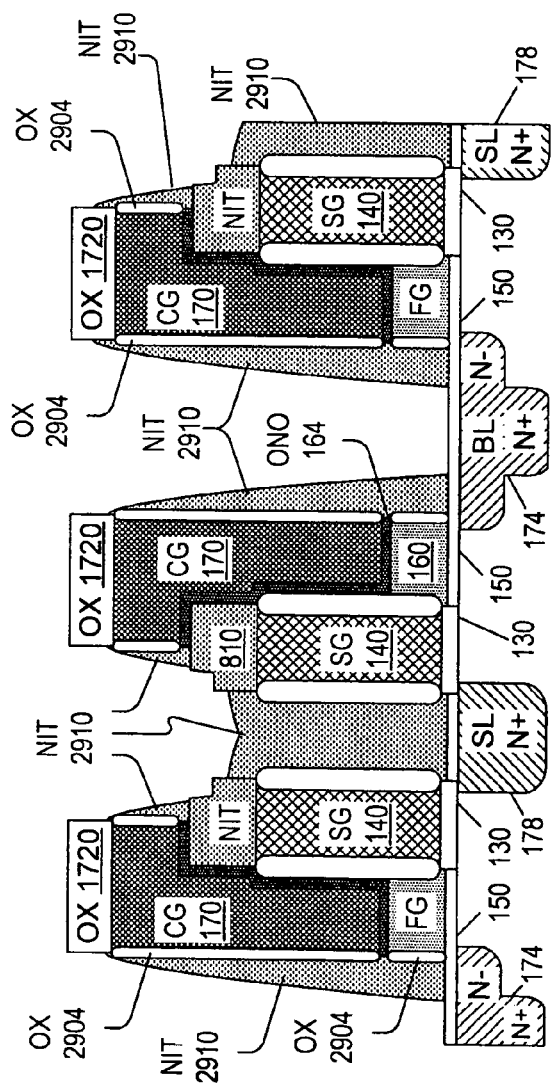
FIG. 23A (X1-X1')
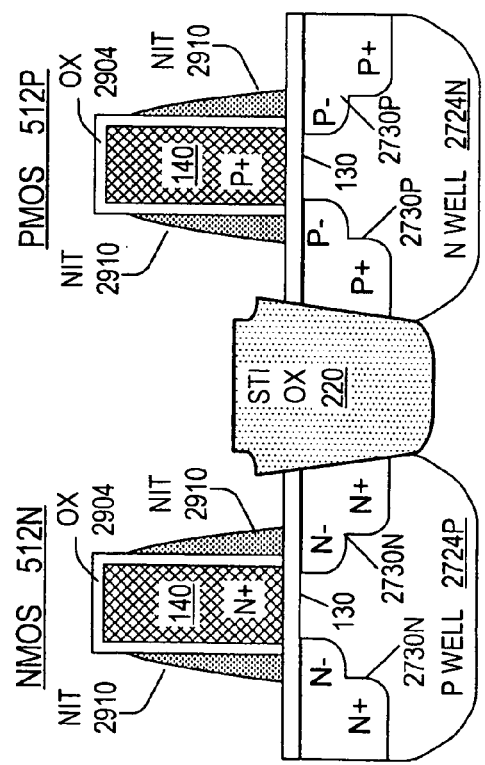
FIG. 23B (PERIPHERY)

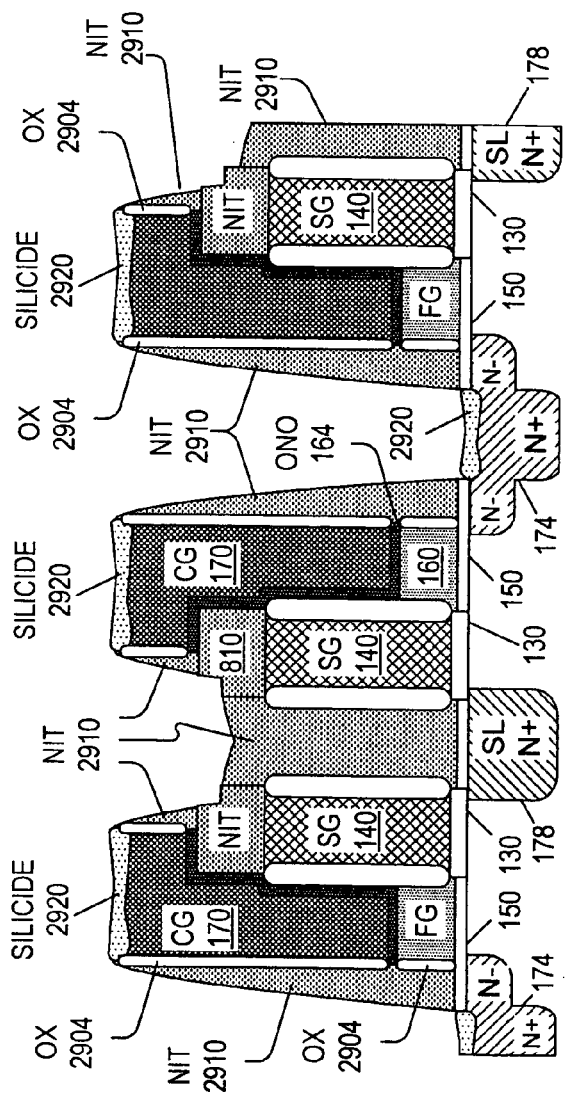
FIG. 24A (X1-X1')
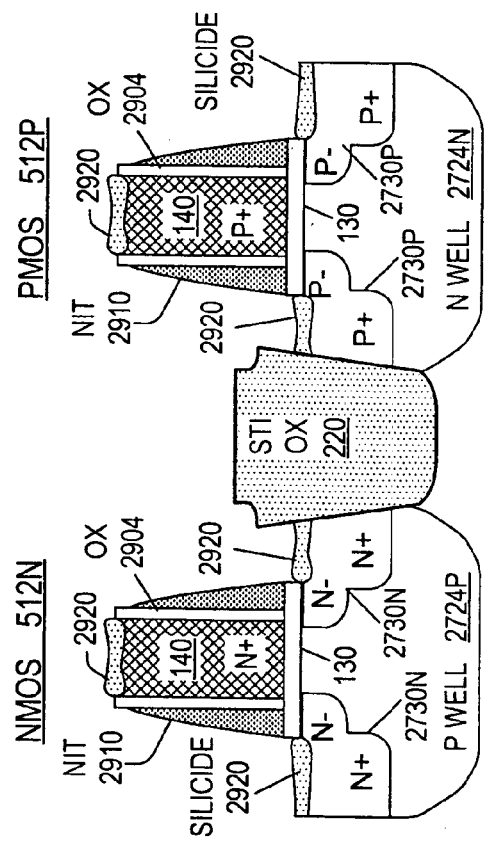
FIG. 24B (PERIPHERY)

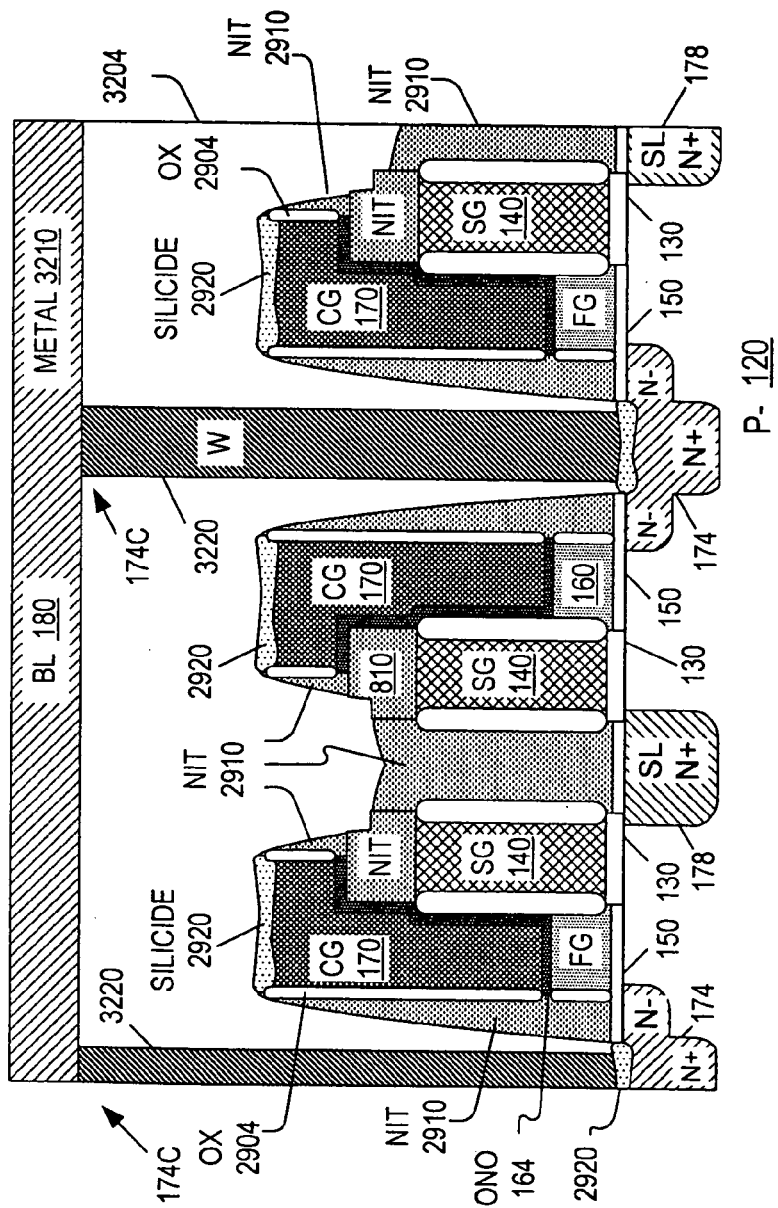
FIG. 25A (X1-X1')

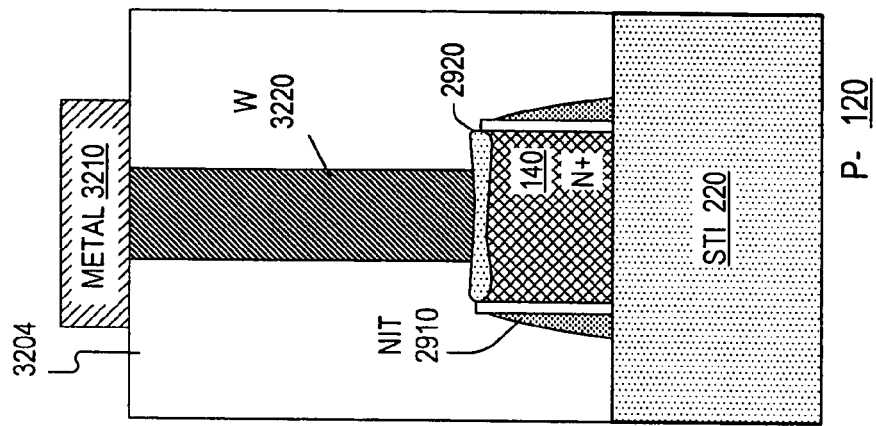
FIG. 25C (PERIPHERY)
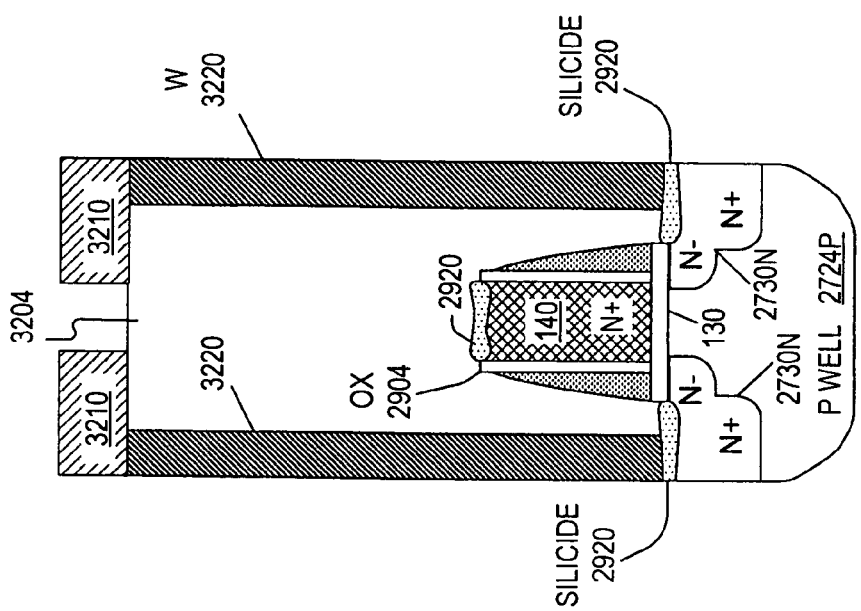
FIG. 25B (PERIPHERY)

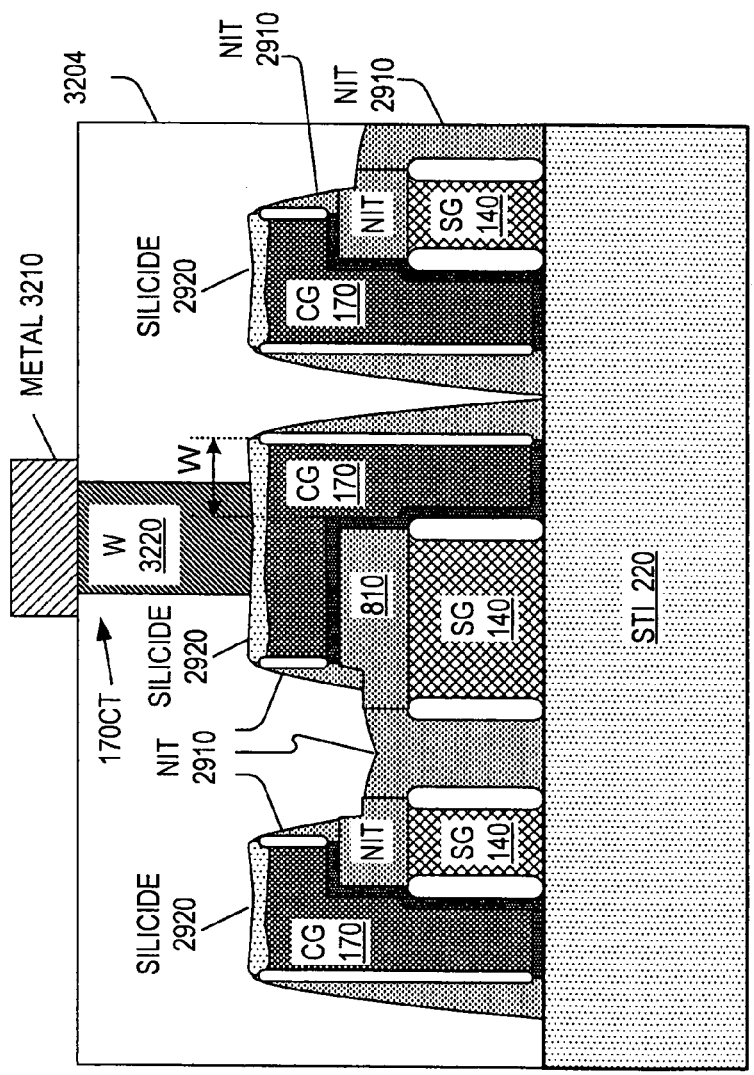
FIG. 25E (X3-X3')
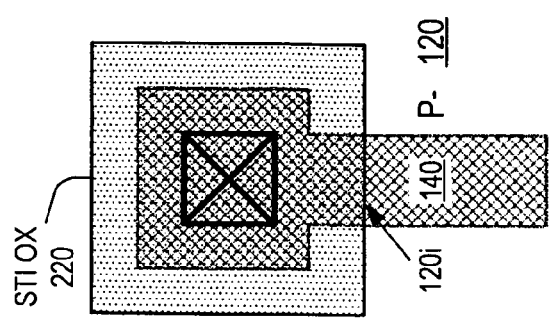
FIG. 25D (PERIPHERY)

INTEGRATED CIRCUITS WITH OPENINGS THAT ALLOW ELECTRICAL CONTACT TO CONDUCTIVE FEATURES HAVING SELF-ALIGNED EDGES

CROSS REFERENCE TO RELATED APPLICATIONS

The present application is a division of U.S. patent application Ser. No. 10/440,500 filed on May 16, 2003, incorporated herein by reference.

BACKGROUND OF THE INVENTION

The present invention relates to integrated circuits, and more particularly to formation of widened contact areas for making electrical contact to conductive features of the integrated circuits.

A conductive feature may have to be widened to accommodate a contact opening. In FIG. 1 (top view), conductive line 102 has a widened portion 102X to accommodate a contact opening 102C formed in an overlying dielectric (not shown).

It is desirable to facilitate formation of widened areas such as 102X.

SUMMARY

This section summarizes some features of the invention. Other features are described in the subsequent sections. The invention is defined by the appended claims which are incorporated into this section by reference.

In some embodiments of the present invention, a widened contact area of a conductive feature is formed in a self-aligned manner using self-alignment between an edge of the conductive feature and an edge of another feature. For example, suppose the other feature ("first feature") is formed from a first layer, and the conductive feature is formed from a second layer overlying the first layer. The conductive feature has an edge self-aligned to an edge of the first feature. The edge of the conductive feature is shaped to provide a widened contact area. This shaping is achieved by shaping the corresponding edge of the first feature. The edge of the first feature may or may not be defined by means of photolithography, but the edge of the conductive feature is defined without photolithography.

Other embodiments and advantages of the invention are described below. The invention is defined by the appended claims.

BRIEF DESCRIPTION OF THE DRAWINGS

FIGS. 4, 5A, 5B, 6A, 6B, 7A, 7B, 8, 9, 10, 11A, 11B, 12, 13A, 13B, 14, 15A, 15B, 16, 17A, 17B 18, 19A, 19B, 20A, 20B, 21A, 21B, 22, 23A, 23B, 24A, 24B, 25A–25C show vertical cross sections of integrated circuit structures according to embodiments of the present invention.

FIG. 25D is a top view of an integrated circuit structure according to an embodiment of the present invention.

FIG. 25E shows a vertical cross section of an integrated circuit structure according to an embodiment of the present invention.

DESCRIPTION OF SOME EMBODIMENTS

The embodiments described in this section illustrate but do not limit the invention. The invention is not limited to particular materials, process steps, or dimensions. The invention is defined by the appended claims.

Figure 1:
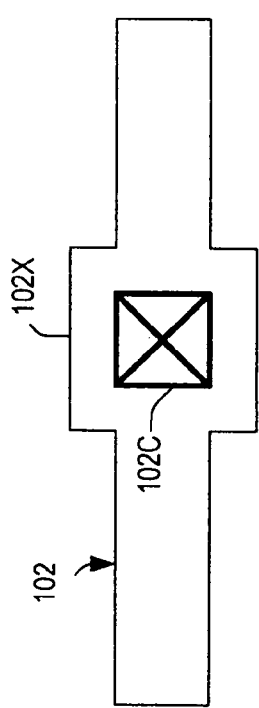
FIG. 1 is a top view of a prior art integrated circuit.
Figure 2:
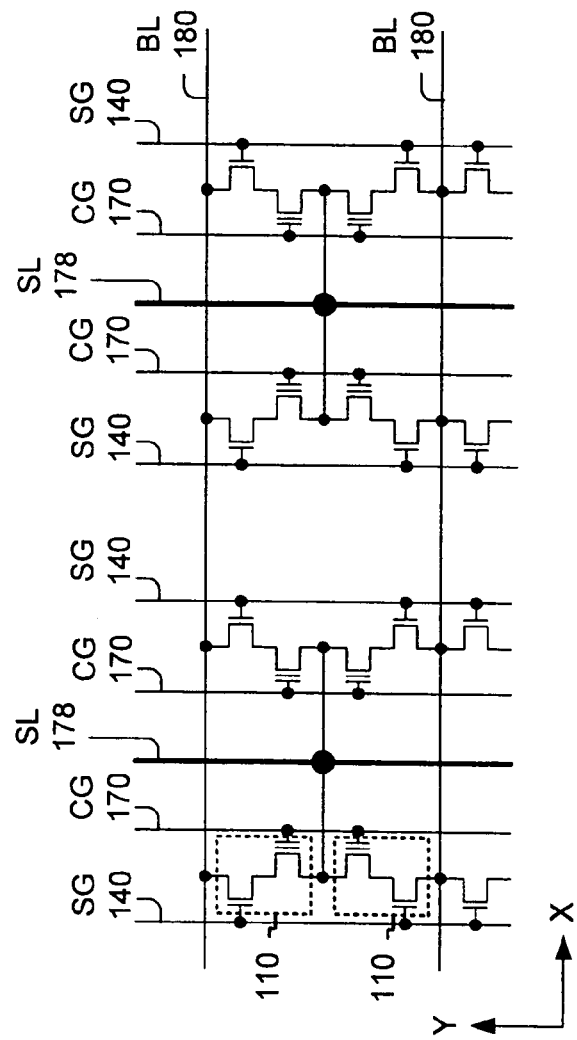
FIG. 2 is a circuit diagram of a memory array in one embodiment of the present invention.
Figure 3:
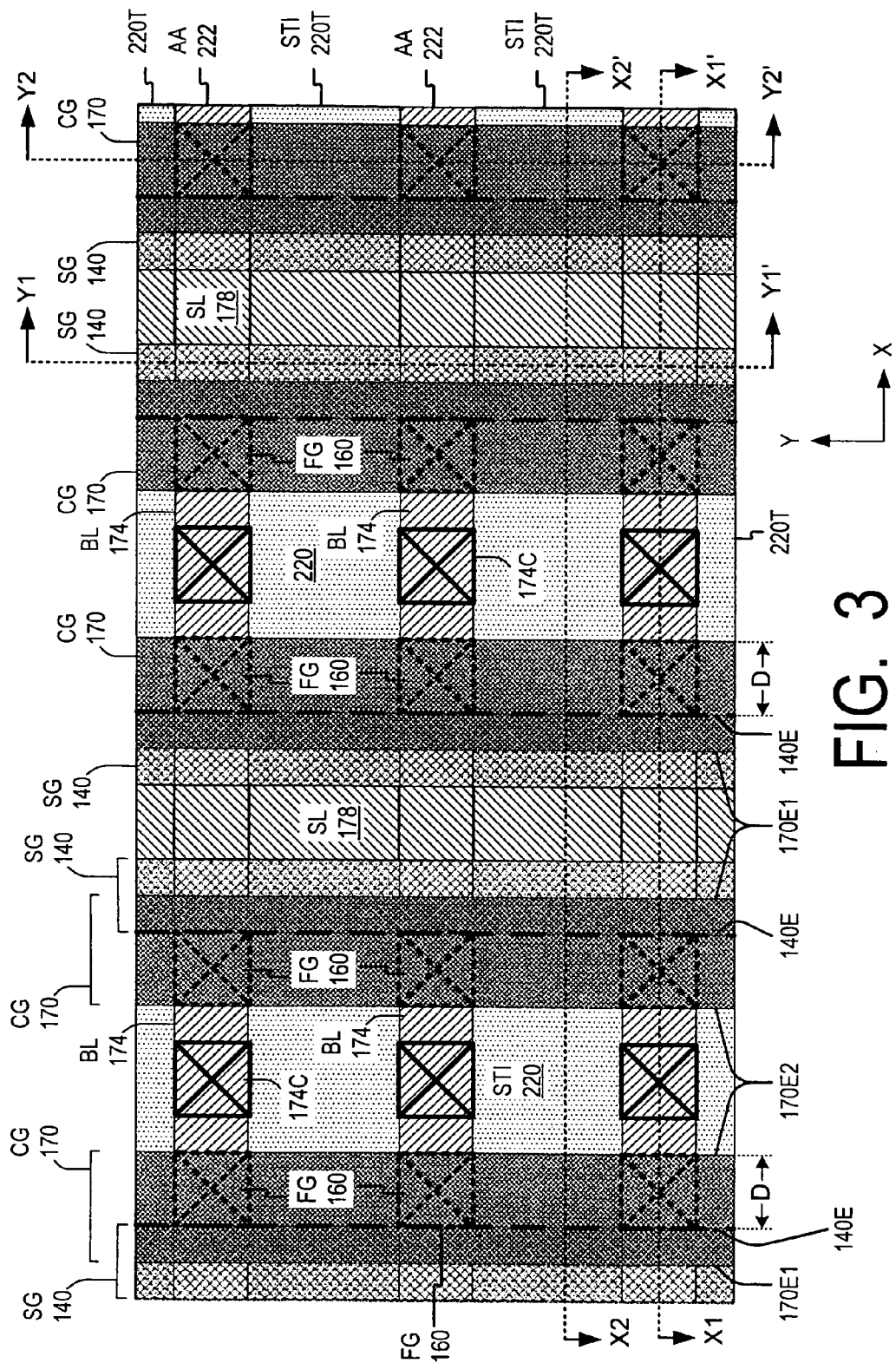
FIG. 3 is a top view of a memory array according to an embodiment of the present invention.

Formation of widened contact areas will now be illustrated on an example of a flash memory array. FIG. 2 is a circuit diagram of the array. This is a NOR type array. The top view is shown in FIG. 3, and a vertical cross section along the line X1—X1 in FIG. 3 is shown in FIG. 25A. In FIG. 2, each memory cell 110 is represented schematically as a floating gate transistor and a select transistor connected in series. The array is formed over a P doped area of semiconductor substrate 120 (FIG. 25A). Silicon dioxide 130 is formed on substrate 120. Select gates 140 are formed on oxide 130. Silicon dioxide 150 (tunnel oxide) is formed on substrate 120, and floating gates 160 are formed on oxide 150. ONO layer 164 (a sandwich of a silicon dioxide layer, a silicon nitride layer, and another silicon dioxide layer) is formed over floating gates 160 and select gates 140. Control gates 170 are formed over ONO 164. N+ source/drain regions 174, 178 are formed in substrate 120.

Turning to FIGS. 2 and 3, select gate lines 140, control gate lines 170, and source lines 178 extend in the row direction (Y direction) throughout the array. Each select gate line 140 provides the select gates for one row of the array. Each control gate line 170 provides the control gates for one row. Each source line 178 provides source/drain regions 178 to two adjacent rows (here the same numeral 178 is used for the source lines and the source/drain regions). Bitlines 180 (FIGS. 2, 25A) extend in the column direction (X direction). Each bitline 180 is connected to source/drain regions 174 of two adjacent columns. The bitlines contact the source/drain regions 174 ("bitline regions") in areas 174C (FIG. 3) marked with a cross. Floating gates 160 are marked with dashed crosses in FIG. 3. Control gate lines 170 overlap the select gates. Each dashed line 140E marks an edge of a select gate line 140 under a control gate line 170. Each control gate line 170 has an edge 170E1 overlying a select gate line 140, and another edge 170E2 which does not overlie the select gate line but runs at some distance D from the select gate line. The edges 170E2 and the distance D can be defined in a self-aligned manner as explained below, to form widened contact areas for the control gates. The edges 170E2 also define the edges of the floating gates 160 on the side of bitline regions 174.

Substrate isolation trenches 220T run through the array in the X direction. Trenches 220T are filled with dielectric 220, but dielectric 220 is etched out of the trenches at the location of source lines 178. Active areas 222 run through the array between the trenches 220T. Each active area 222 includes active areas of individual cells in one memory column. The active area of each cell consists of the cell's source/drain regions 174 and 178 and the P type channel region extending between the regions 174, 178. Numeral 178 denotes both a source line and a source/drain region ("source line region") of one memory cell.

Some of the figures below illustrate vertical cross sections of intermediate structures obtained during the memory fabrication. The sectional planes are indicated in FIG. 3 by lines X1–X1', X2–X2', Y1–Y1', and Y2–Y2'. The line X1–X1' runs in the X direction through an active area 222. The line X2–X2' runs in the X direction through a trench 220T. The line Y1–Y1' runs in the Y direction through a select gate line 140. The line Y2—Y2 runs in the Y direction through a control gate line 170 and floating gates 160.

In one embodiment, the memory is fabricated as follows. Substrate isolation regions 220 are formed in P doped substrate 120 by shallow trench isolation technology ("STI"). See FIG. 4 (cross section Y1–Y1'). Each region 220 is a dielectric region formed in a trench 220T. Suitable STI processes are described in U.S. Pat. No. 6,355,524 issued Mar. 12, 2002 to Tuan et al.; U.S. patent application Ser. No. 10/262,785 filed Oct. 1, 2002 by Yi Ding (now U.S. Pat. No. 6,743,675,issued on Jun. 1, 2004); and U.S. patent application Ser. No. 10/266,378 filed Oct. 7, 2002 by C. Hsiao, all incorporated herein by reference. Other STI and non-STI processes are also possible. We will sometime refer to dielectric 220 as "STI oxide" because it is silicon dioxide in some embodiments. The invention is not limited to such embodiments or to silicon integrated circuits.

Substrate isolation regions are also formed in the memory peripheral area (not shown in FIG. 4). The peripheral area contains circuitry needed to access the memory, and may also contain unrelated circuitry (the memory may be embedded into a larger system).

As shown in FIG. 4, oxide 220 protrudes above the substrate 120. The protruding portions are shown at 220P. An exemplary thickness of portions 220P is 0.12 μm for a 0.18 μm fabrication process (a process with a 0.18 μm minimum line width). The exemplary dimensions given in this section assume a 0.18 μm fabrication process unless mentioned otherwise.

Dopant is implanted into substrate 120 to form an N type region 604 underlying the memory array. Dopant is also implanted into the substrate around the array to form a surrounding N type region (not shown) extending from the top surface of substrate 120 down to region 604. These implants create a fully isolated P well 120W for the memory array. Region 604 is not shown in the subsequent drawings, and the P well 120W is shown simply as substrate 120.

Silicon dioxide 130 (FIG. 5A, cross section Y1–Y1', and FIG. 5B, periphery) is thermally grown on the exposed areas of substrate 120 to provide gate dielectric for the select gates of the memory array and for the peripheral transistors. An exemplary thickness of oxide 130 in the array area is 120 Å. Generally, the oxide thickness depends on the maximum voltage that the oxide 130 is designed to sustain during the memory operation.

In the example shown in FIG. 5B, the peripheral area includes a high voltage transistor area 512H and a low voltage transistor area 512L. Oxide 130 is grown thermally to a thickness of 60 Å over the entire wafer. This oxide is removed from the low voltage area 512L by a masked etch. The wafer is re-oxidized to re-grow silicon dioxide in area 512L to a thickness of 60 Å. The oxide thickness in the memory array area and in high voltage area 512H increases from 60 Å to 120 Å during this step.

As shown in FIG. 6A (cross section Y1–Y1') and FIG. 6B (periphery), intrinsic polysilicon layer 140 is formed over the structure by a conformal deposition process (e.g. low pressure chemical vapor deposition, "LPCVD"). Polysilicon 140 fills the spaces between the oxide protrusions 220P in the memory array area. The top polysilicon surface is planar because the polysilicon portions deposited on the sidewalls of protrusions 220P meet together.

FIG. 6B may represent either the low voltage or the high voltage transistor area. In some embodiments, there are more than two peripheral areas with different gate oxide thicknesses, and FIG. 6B may represent any of these areas.

Polysilicon 140 covers the regions 120i (FIG. 6B) at the interface between substrate 120 and field oxide 220 in the peripheral area. Polysilicon 140 will protect the oxide 220 in this area to prevent formation of grooves ("divots") during subsequent processing. Polysilicon 140 will be used to form the peripheral transistor gates. The grooving in regions 120i under the transistor gates is undesirable because it degrades the transistor characteristics.

Non-conformal deposition processes, whether known or to be invented, can also be used for layer 140. If the top surface of polysilicon 140 is not planar, it is believed that the polysilicon 140 can be planarized using known techniques (e.g. CMP, or spinning a photoresist layer over the polysilicon 140 and then simultaneously etching the resist and the polysilicon at equal etch rates until all of the photoresist is removed). The bottom surface of polysilicon 140 is non-planar as it goes up and down over the oxide protrusions 220P.

An exemplary final thickness of polysilicon 140 is 0.16 μm over the active areas.

Silicon dioxide layer 780 (FIG. 6B) is formed over the wafer, by TEOS CVD for example, to a thickness of 400–500 Å. This layer will serve as an etch stop in a silicon nitride etch. Optionally, oxide 780 is removed from the array area by a masked etch.

The peripheral area is masked, and polysilicon 140 is doped N+ in the array area. Polysilicon 140 remains undoped ("INTR", i.e. intrinsic) in the periphery. The peripheral transistor gates will be doped later, with the NMOS gates doped N+ and the PMOS gates P+, to fabricate surface channel transistors in the periphery with appropriate threshold voltages. The invention is not limited to the surface channel transistors or any peripheral processing. In particular, entire polysilicon 140 can be doped N+ or P+ after the deposition or in situ.

Silicon nitride 810 is deposited on polysilicon 140, by LPCVD for example, to an exemplary thickness of 1500 Å. If desired, a pad oxide layer (not shown) can be formed on polysilicon 140 before the nitride deposition. The pad oxide layer will provide an additional protection for the select gates during the patterning of control gate polysilicon 170 described below.

In some embodiments, the top surface of polysilicon 140 and/or nitride 810 is not planar.

The wafer is coated with a photoresist layer 820. See FIG. 7A, cross section X1–X1', and FIG. 7B, periphery. (FIG. 7B shows only the active area, not the field oxide 220.) Resist 820 is patterned to define the select gate lines 140. The peripheral area is covered by the resist. Edges 140E of select gate lines 140 are adjacent to the future positions of source lines 178. The memory array geometry is not sensitive to a misalignment between mask 820 and the mask defining the isolation trenches 220T (FIG. 3) except possibly at the boundary of the memory array.

Silicon nitride 810 is etched through the resist openings. The resist is removed, and polysilicon 140 is etched away where exposed by nitride 810. Then the exposed oxide 130 is removed. The select gate lines are formed as a result. (In an alternative embodiment, the resist defining the nitride 810 is removed after the etch of polysilicon 140 and/or oxide 130.)

As shown in FIG. 8 (cross section X1–X1'), the structure is oxidized to grow silicon dioxide 150 on substrate 120 and the sidewalls of polysilicon gates 140 in the array area. Oxide 150 will serve as tunnel oxide on substrate 120, and will provide sidewall insulation for the select gates. The oxide thickness depends on the dopants and dopant concentrations. In one embodiment, oxide 150 is 90 Å thick on substrate 120, and is 300 Å thick on the select gate sidewalls. The peripheral area is covered by nitride 810 (FIG. 6B), and remains substantially unchanged during this step.

Floating gate polysilicon 160 (FIG. 9, cross section X1–X1') is deposited over the structure, by LPCVD for example, and is doped during or after the deposition. Polysilicon 160 is sufficiently thick to ensure that its top surface is at least as high throughout the wafer as the top surface of nitride 810. In the embodiment of FIG. 9, the top surface of layer 160 is planar due to a conformal deposition to a thickness larger than half the distance between the adjacent select gate lines 140. In one embodiment, the distance between select gate lines 140 over the future positions of bitline regions 174 is 0.8 μm, and the polysilicon 160 is more than 0.4 μm thick.

If the top surface of polysilicon 160 is not planar, it is planarized by CMP or a suitable etch.

After planarization (if needed), layer 160 is etched down without a mask. The etch end point is when STI oxide 220 becomes exposed. FIG. 10 (cross section X1–X1') shows an intermediate stage in this etch, when nitride 810 becomes exposed. At this stage, layer 160 has been removed from the periphery, so the periphery becomes as in FIG. 6B.

FIGS. 11A (cross section X1–X1') and 11B (cross section Y2–Y2') show the array area at the end of the polysilicon etch. The polysilicon has been removed from the top surface of oxide 220. In some embodiments, the final thickness of layer 160 is 1200 Å. The etch is selective to nitride 810.

Optionally, a timed etch of oxide 220 is performed to recess the top surface of oxide 220 below the surface of polysilicon 160. See FIG. 12 (cross section Y2–Y2'). This etch will improve the capacitive coupling between the floating and control gates. See the aforementioned U.S. Pat. No. 6,355,524. In the embodiment of FIG. 12, the oxide 220 continues to protrude above the top surface of substrate 120 by at least 0.10 μm. In other embodiments, the oxide 220 does not protrude above the substrate after the etch (the top surface of layer 220 is level with the top surface of the substrate after the oxide etch).

ONO layer 164 (FIG. 13A, cross section X1–X1', and FIG. 13B, periphery) is formed over the structure. Control gate polysilicon layer 170 is deposited on ONO 164 and is doped during or after the deposition.

The top surface of polysilicon 170 is not planar in the array area. Layer 170 has protrusions 170.1 over the select gate lines 140. Cavities 170C form in layer 170 between protrusions 170.1 over the future positions of bitline regions 174. The protrusions 170.1 will be used to define the overlap between the floating and control gates without additional dependence on photolithographic alignment.

In FIG. 13A, polysilicon 170 is substantially planar over the future positions of source lines 178 because the source lines 178 are fairly narrow (0.22 μm width in some embodiments) and layer 170 is relatively thick (e.g. 0.18 μm). In other embodiments, the layer 170 is not planar over the source lines 178, and a cavity 170C forms over each source line. The topography of layer 170 depends on the underlying topography, the thickness of polysilicon 170, and the polysilicon deposition process.

As shown in FIGS. 14 (cross section X1–X1'), a layer 1710 is deposited over the structure and etched without a mask to expose the polysilicon 170. Layer 1710 fills the cavities 170C. When layer 1710 is etched in the array area, layer 1710 is removed in the periphery, so the periphery becomes as in FIG. 13B. In one embodiment, layer 1710 is silicon nitride deposited to have a planar top surface or planarized during the etch.

In some embodiments, the etch of nitride 1710 continues after the exposure of polysilicon 170, and the nitride etch exposes the sidewalls of polysilicon protrusions 170.1 (FIG. 13A). Whether or not the polysilicon sidewalls are exposed, the exposed edges of polysilicon 170 define the control gate edges 170E2 (FIG. 3) as described below. Therefore, the edges 170E2 and the distance D are defined without resort to photolithography. In some embodiments, D=0.18 μm. The overlap between the floating and control gates is also defined without photolithography.

The wafer is oxidized to grow silicon dioxide 1720 on the exposed polysilicon 170. See FIG. 15A (cross section X1–X1') and FIG. 15B (periphery). An exemplary thickness of oxide 1720 is 500 Å.

In some embodiments, layer 1720 is some other material formed selectively on polysilicon 170. For example, layer 1720 can be a conductive metal silicide formed by a salicide (self-aligned silicidation) technique.

The wafer is coated with photoresist 1730 (FIG. 16, cross section X1–X1'). Openings are formed in the resist over the future positions of source lines 178. The location of the longitudinal edges of mask 1730 is the location of the future positions of control gate edges 170E1 (see also FIG. 3). These edges can be located anywhere over select gate lines 140. The resist is removed from the peripheral area.

Oxide 1720 and at least a portion of polysilicon 170 are removed where exposed by resist 1730. See FIG. 17A, cross section X1–X1', and FIG. 17B, periphery. The etch of polysilicon 170 may stop when ONO 164 is exposed, or may continue after the exposure of ONO 164. In either case, polysilicon 170 is etched away in the periphery. When ONO 164 is exposed, the etch may continue for a predetermined time (a timed etch), or may continue until all of the exposed polysilicon 170 is removed. In one embodiment, the polysilicon etch is a timed etch reducing the thickness of polysilicon 170 over the source lines to about 0.18 μm.

Resist 1730 and nitride 1710 are removed. The resulting structure is shown in FIGS. 18 (cross section X1–X1'). The periphery remains as in FIG. 17B.

Polysilicon 170, ONO 164, and polysilicon 160 are etched with oxide 1720 as a mask. The resulting structure is shown in FIG. 19A (cross section X1–X1') and FIG. 19B (periphery). In some embodiments, the polysilicon etch of layers 170, 160 is anisotropic, and the etch of ONO 164 is isotropic or anisotropic. The etch of ONO 164 may remove portions of oxide 1720 and/or nitride 810, and may also remove some oxide 150 on the sidewalls of select gate lines 140.

The wafer is coated with photoresist 2620 (FIG. 20A, cross section X1–X1'). The resist is patterned to expose the source lines 178. Each source line 178 traverses the memory array between two adjacent control gate lines 170, and provides one source/drain region to each cell in the two rows associated with the two control gate lines. The edges of the resist openings can be positioned anywhere over select gate lines 140 or floating gates 160. The periphery is covered by the resist.

Silicon dioxide 220 is etched out of trenches 220T in the areas exposed by resist mask 2620 (FIG. 20B, cross section X2–X2'). This etch removes oxide 150 in the active areas over the source lines (FIG. 20A). This etch may also remove the exposed portions oxide 1720 if oxide 1720 is not entirely covered by the resist. Then the source line implant (N+) is performed using the same mask. In some embodiments, this is a high energy, high dose implant, possibly preceded by a lower energy, low dose, large angled implant (the angle can be 10° to 30° for example), to achieve a 0.1 µm to 0.2 µm source line diffusion depth.

In an alternative embodiment, when the resist mask 2620 has been formed, a high energy N+ implant is performed before the etch of oxide 220, then oxide 220 is etched out of the trenches using the same mask, and then another, lower energy N type implant is performed using the same mask. The first (high energy) implant is at least partially blocked by oxide 220 in the trenches to avoid shorting the source lines 178 to N type isolation region 604 (FIG. 4). See the aforementioned U.S. Pat. No. 6,355,524.

Resist 2620 is removed. Another photoresist layer (not shown) is formed over the wafer and patterned to cover the array but expose the entire periphery. Then nitride 810 (FIG. 19B) is etched away from the peripheral area. Oxide 780 serves as an etch stop during the nitride etch. Then oxide 780 is removed.

The resist covering the array is removed, and another photoresist layer (not shown) is formed to cover the array and define the peripheral transistor gates. Polysilicon 140 is etched away where exposed by this resist.

The resist is removed. The wafer is coated with a photoresist layer 2720 (FIG. 21B, periphery). The resist is patterned to expose the entire array area (FIG. 21A, cross section X1–X1') and also to expose the peripheral NMOS transistor regions. FIG. 21B shows a peripheral NMOS transistor region 512N with a P well 2724P, and a peripheral PMOS transistor region 512P with an N well 2724N. These wells were defined before formation of oxide 130. There can be many regions 512N, 512P in the integrated circuit. Resist 2720 covers the PMOS transistor regions 512P. An N type implant (N−) is performed to form the LDD (lightly doped drain) extensions for peripheral NMOS source/drain regions 2730N (FIG. 21B). This implant also dopes the NMOS gates 140 in the periphery. In addition, the implant dopes bitline regions 174 (FIG. 21A) and increases the dopant concentration in source lines 178.

In some embodiments, the memory array is not exposed by resist 2720, and no doping is performed in the source lines and the bitline regions at this step.

Resist 2720 is removed, and another photoresist layer 2820 (FIG. 22, periphery) is formed to cover the NMOS peripheral transistor regions 512N and the memory array. A P type implant (P−) is performed to form the LDD extensions for PMOS source/drain regions 2730P and to dope the peripheral PMOS transistor gates.

Resist 2820 is removed. A thin silicon dioxide layer 2904 (see FIG. 23A, cross section X1–X1', and FIG. 23B, periphery) is grown on the exposed silicon surfaces of layers 140, 160, 170 by a rapid thermal oxidation process (RTO). Alternative techniques can also be used such as chemical vapor deposition (e.g. TEOS CVD), a high temperature oxide process (HTO), or other suitable techniques, known or to be invented. These techniques may form the oxide 2904 over the entire structure and not only on the silicon surfaces. An exemplary thickness of oxide 2904 is 100 Å.

A thin silicon nitride layer 2910 is deposited and etched anisotropically without a mask to form sidewall spacers over the gate structures. The etch of nitride 2910 may remove some of nitride 810 in the array area (FIG. 23A). If oxide 2904 was deposited over the entire structure (by TEOS CVD or HTO for example), oxide 2904 will help protect the substrate 120 during the nitride etch. Spacers 2910 meet over the source lines 178 and create a thick nitride layer over the source lines. In other embodiments, the spacers do not meet over the source lines.

Then N+ and P+ implants are performed to create source/drain structures for the peripheral transistors and the bitline regions 174. More particularly, the peripheral PMOS transistor area 512P is masked with resist (not shown), and an N+ implant is performed to create the source/drain structures for bitline regions 174 and the peripheral NMOS transistors and increase the dopant concentration in the peripheral NMOS gates 140. The floating, control and select gates and the overlying nitride layers mask this implant so no additional masking in the array area is needed.

The resist is removed. The array and the peripheral NMOS transistor regions 512N are masked with a resist (not shown), and a P+ implant is performed to create the source/drain structures for the peripheral PMOS transistors and increases the dopant concentration in the PMOS transistor gates 140.

The resist is removed. A silicon dioxide etch is performed to remove the oxide 1720 and expose the control gate lines 170 (FIG. 24A, cross section X1–X1'). This etch also removes the exposed portions of oxide 150 over bitline regions 174 in the array area, the exposed oxide 130 over source/drain regions 2730N, 2730P in the periphery (see FIG. 24B), and the oxide 2904 over the peripheral transistor gates.

A conductive metal silicide layer 2920 is formed by a self-aligned silicidation (salicide) process on the exposed silicon surfaces of control gate lines 170, bitline regions 174, peripheral transistor gates 140 and peripheral source/drain regions 2730N, 2730P. The salicide process involves depositing a metal layer, heating the structure to react the metal with the silicon, and removing the unreacted metal. This can be followed by an anneal or any other suitable processing, known or to be invented, to improve the silicide properties (e.g. increase its conductivity). Titanium, cobalt, nickel, and other conductive materials, known or to be invented, can be used for the metal layer. Non-salicide selective deposition techniques, known or to be invented, that selectively form a conductive layer 2920 on the exposed silicon but not on a non-silicon surface, can also be used.

As noted above in connection with FIG. 15, layer 1720 can be a conductive metal silicide formed by a salicide process. In this case, layer 1720 does not have to be removed. The silicidation process of FIG. 24A will silicide the bitline regions 174, the peripheral gates 140 and the peripheral source/drain regions 2730.

Figure 25F:
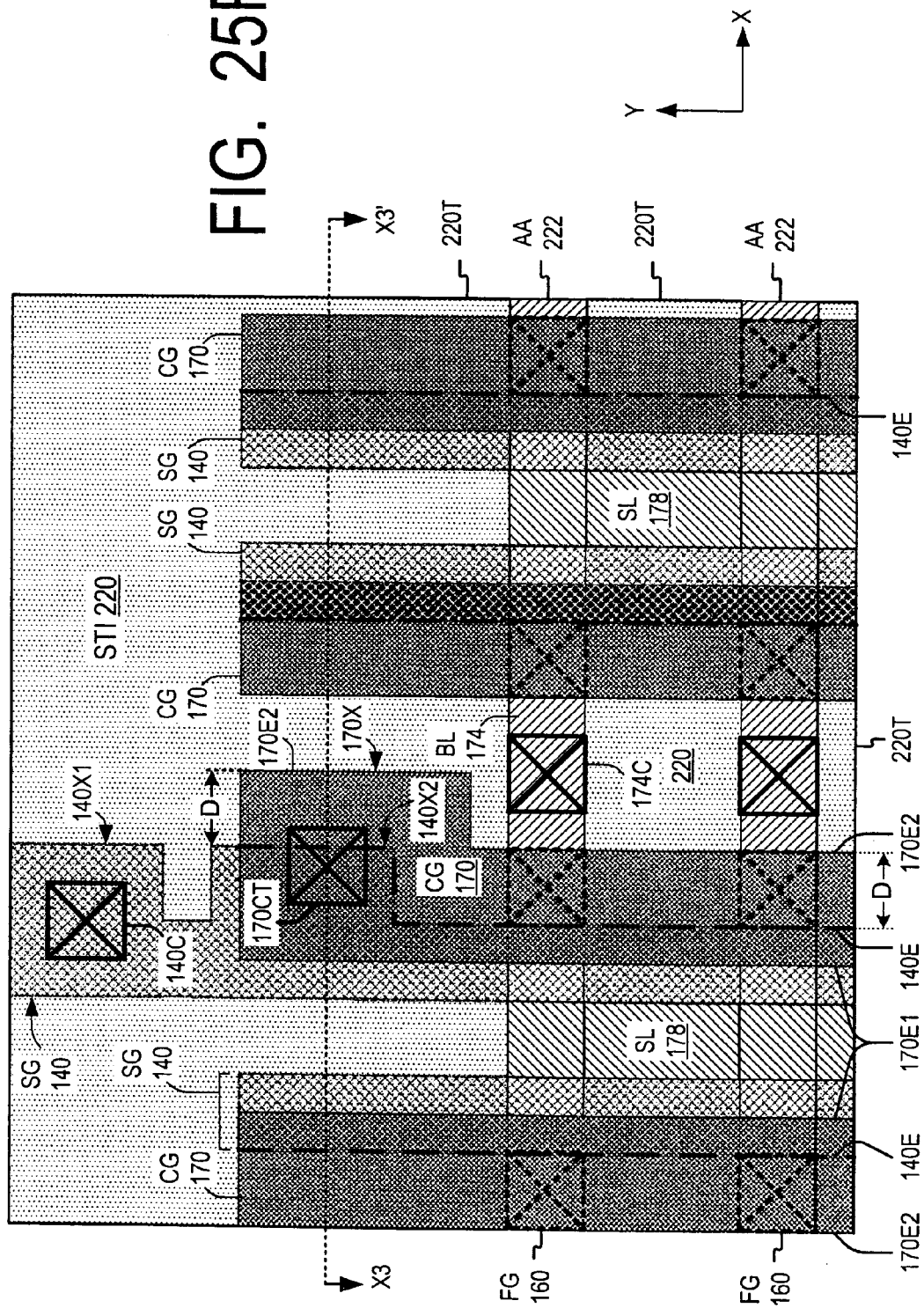
FIG. 25F is a top view of an integrated circuit structure according to an embodiment of the present invention.

As shown in FIG. 25A (cross section X1–X1') and FIGS. 25B and 25C (periphery), inter-level dielectric 3204 is deposited over the wafer. FIG. 25C shows only an NMOS transistor region, but the PMOS regions are similar. See also FIG. 25E showing an array cross section X3–X3' described below in connection with FIG. 25F. Contact openings are etched in dielectric 3204 to expose the silicided surfaces of bitline regions 174 (FIG. 25A), source/drain regions 2730P and 2730N (FIG. 25B), peripheral gates 140 (FIG. 25C), and control gates 170 (FIG. 25E). The silicide 2920 protects the bitline regions 174 and the source/drain regions 2730 during this etch. A conductive layer 3210 (e.g. metal) is deposited and patterned to form the bitlines 180 and possibly other features. The figures also show an optional metal layer 3220 (e.g. tungsten) used to fill the contact openings before the deposition of layer 3210.

FIG. 25D (top view) shows an extension of a peripheral transistor gate 140 over STI oxide 220. The extension can be made to form a contact to the gate or for some other reason (e.g. to connect the gate to other features). The region 120*i* at the interface between the substrate 120 and field oxide 220 is protected from the divot formation because the gate is formed using the first polysilicon layer 140. See also FIG. 6B. The transistor of FIG. 25D can be a high voltage transistor (in area 512H in FIG. 5B) or a low voltage transistor (in area 512L).

FIGS. 25E, 25F illustrate the boundary of the memory array. Contacts to control gate lines 170 and select gate lines 140 are formed in this area. FIG. 25F is a top view, and FIG. 25E illustrates a vertical cross section along the line X3–X3' in FIG. 25F. The line X3–X3' passes through control gate contact opening 170CT formed in dielectric 3204. Control gate contact opening 170CT and select gate contact opening 140C are formed over STI oxide 220. Control gate line 170 has a widened portion 170X to accommodate the contact opening 170CT. Select gate line 140 has a widened portion 140X1 to accommodate the select gate contact opening 140C.

Select gate line 140 has another widened portion 140X2 under the widened portion 170X of the control gate line. The portion 170X is created in a self-aligned manner by the widened portion 140X2. As shown in FIGS. 3, 14, and 19A, the control gate edge 170E2 follows the select gate edge 140E at the distance D from the select gate. The distance D is defined without photolithography as explained above. The select gate edges are defined by mask 820 (FIG. 7A). The select gate edges are straight edges in this embodiment, but in the area shown in FIG. 25F the edge 140E deviates from the straight line to widen the select gate to form the region 140X2. Consequently, the control gate edge 170E2 deviates from the straight line to form the widened region 170X in a self-aligned manner.

Other details of the memory fabrication process for one embodiment are given in U.S. patent application Ser. No. 10/393,212 "NONVOLATILE MEMORIES AND METHODS OF FABRICATION" filed Mar. 19, 2003 by Yi Ding (now U.S. Pat. No. 6,962,851, issued on Nov. 8, 2005) and incorporated herein by reference.

In one embodiment, the memory cells 110 are programmed by channel hot electron injection. The corresponding select gate 140 is held at a voltage sufficiently high to invert the underlying portion of the cell's channel region. Control gate 170 is driven high relative to substrate 120 to raise the voltage on floating gate 160 relative to the channel region and invert the channel region under the floating gate. A voltage difference is provided between the source/drain regions 174, 178 to induce a current and cause the hot electron injection from the channel region into the floating gate. The cells are erased by Fowler-Nordheim tunneling through the channel regions ("bulk erase"). The cells are read by sensing a current on bitlines 180 when the select gate 140 is at a high enough voltage to invert the underlying portion of the channel region, the control gate 170 is at an appropriate voltage to invert the underlying portion of the channel region if, and only if, the cell is erased, and a voltage difference is induced between the source/drain regions 174, 178. Exemplary voltages are shown below in Table 1. Vcc is assumed to be 2.7V to 3.6V. "Selected" means the memory cell is selected by the address signals. Of note, a select gate line, a control gate line, or other lines can be shared by both selected and unselected memory cells. In such cases, the "selected" voltages apply.

TABLE 1

|  | SG 140 | CG 170 | BL 180 | SL 178 | P well 120 W |
|---|---|---|---|---|---|
| Read |  |  |  |  |  |
| Selected: | Vcc | Vcc | 1.0 V | 0 V | 0 V |
| Not selected: | 0 V | 0 V | 0 V | 0 V | 0 V |
| Program |  |  |  |  |  |
| Selected: | 2.0 V | 10.0 V | 6 V | 0 V | 0 V |
| Not selected: | 0 V | 0 V | Vcc | 0 V | 0 V |
| Erase: | 2.0 V | −10.0 V | Float | Float | 8 V |

Figure 26:
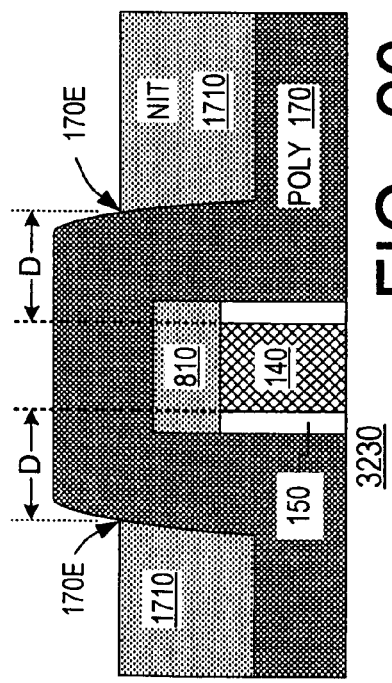
FIGS. 26, 27, 28 show vertical cross sections of integrated circuit structures in some embodiments of the present invention.

The contact formation method illustrated in FIGS. 25C, 25D is suitable for making widened contact areas in other memory and non-memory integrated circuits. FIG. 26 shows an exemplary vertical cross section of an integrated circuit that may or may not contain a memory. Substrate 3230 is a semiconductor substrate or a composite substrate comprising semiconductor and non-semiconductor layers. A feature 140 is formed in or over substrate 3230. Feature 140 protrudes upward above the surface of substrate 3230. This may be a conductive feature, shown surrounded on the sides and on top by dielectric layers 150, 810. Alternatively, the feature 140 may be dielectric, or may include a combination of conductive, dielectric, and semiconductor materials. Layers 150, 810 may be omitted. A conductive layer 170 (e.g. doped polysilicon) is deposited over the layer 140. Layer 170 has an upward protrusion at the location of feature 140. A layer 1710 (e.g. silicon nitride) is deposited over layer 170. Layer 1710 is planarized by CMP or a suitable etch. In the example of FIG. 26, layer 1710 is etched down to a level below the top surface of layer 170. In other embodiments, the top surface of layer 1710 is co-planar with the top surface of layer 170. In either case, the edges 170E of the exposed portion of layer 170 are at some lateral distance D from the layer 140. The edges 170E are defined without photolithography by the etch of nitride 1710. Other parts of layer 170 may be defined photolithographically, e.g. by a masked etch following the etch of nitride 1710.

Figure 28:
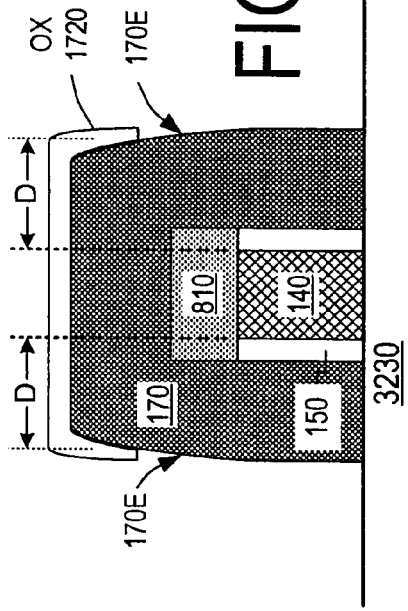
Figure 27:
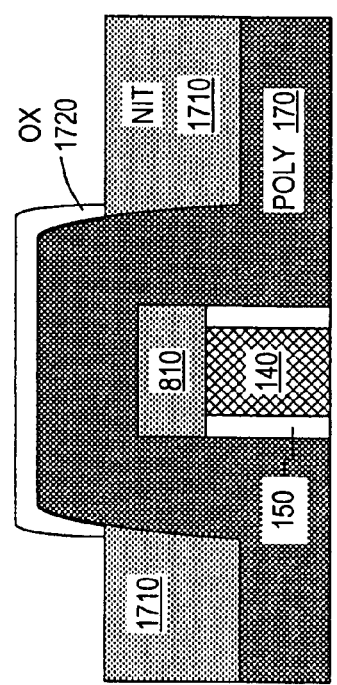

A layer 1720 (FIG. 27) is selectively formed on the exposed portion of layer 170. This may be silicon dioxide thermally grown on layer 170 if the top surface of layer 170 contains silicon. Layer 1720 may also be a silicide formed by a salicide process. Then layer 1710 is removed, and layer 170 is etched with the layer 1720 as a mask (FIG. 28). The edges 170E in FIG. 28 may be offset from their position in FIG. 26 due to the thickness of oxide 1720 and due to the polysilicon 170 etch parameters. For example, the etch of polysilicon 170 may be a perfectly anisotropic etch, or it may have a horizontal component. These variations may affect the final shape of layer 170, and the distance D between the edges 170E of layer 170 and the edges of feature 140. In any event, the position of edges 170E and the distance D are defined in a self aligned manner.

Layer 1720 may be removed, and/or other processing (e.g. formation of spacers and silicidation) may be performed as needed.

The structure is covered with dielectric (not shown), and a contact opening 170CT (FIG. 29, top view) is formed to allow electrical contact to layer 170. The contact opening may have to be etched through layer 1720 (FIG. 28) if layer 1720 has not been removed and is not a conductive layer.

Figure 29:
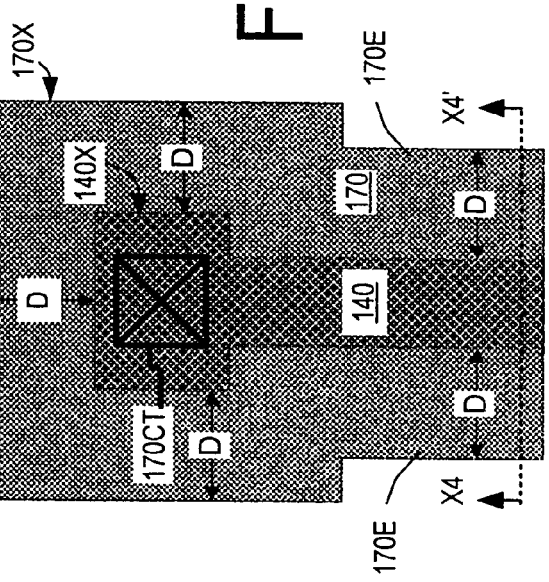
FIG. 29 is a top view of an integrated circuit structure in one embodiment of the present invention.

The cross section of FIG. 28 is taken along the line X4—X4 shown in FIG. 29. In the example of FIG. 29, the feature 140 is a straight line having a widened portion 140X. The self-aligned edges 170E deviate from a straight course near the widened portion 140X to provide a widened portion 170X of layer 170. The portion 170X is wide enough to accommodate the contact 170CT.

U.S. patent application Ser. No. 10/393,212 (now U.S. Pat. No. 6,962.851) mentioned above describes other methods to self-align at least one edge of a conductive layer (such as layer 170) to an underlying layer (such as layer 140). See also U.S. patent application Ser. No. 10/393,202 (now U.S. Pat No. 6,995,060, issued on Feb. 7, 2006) and U.S. patent application Ser. No. 10/411,813, (now U.S. Pat No. 6,893, 921, issued on May 17, 2005), both filed by Yi Ding and incorporated herein by reference. These self-alignment methods, and possibly other self-alignment methods, can be combined with the methods of FIGS. 25A–29 to provide self-aligned widened contact areas.

The invention is not limited to a particular shape of feature 140, or to any circuitry, structure, materials, or fabrication methods. In some embodiments, a portion of the widened contact area 170X is defined photolithographically, e.g. one edge is defined photolithographically and the other edge 170E2 is defined without photolithography by being self-aligned to the edge 140E. Other embodiments and variations are within the scope of the invention, as defined by the appended claims.

The invention claimed is:

1. An integrated circuit comprising:
   a first feature having a top surface having a first edge positioned higher than an adjacent area which is adjacent to the first edge;
   a second feature at least a portion of which overlies the first feature so as to overlie the first edge and the adjacent area, wherein the second feature is a conductive feature, wherein in top view the second feature has a first edge which is part of a lateral boundary of the second feature on a first side of the second feature, and a second edge which is part of the lateral boundary of the second feature on a second side of the second feature, the second side being opposite to the first side, wherein in top view the second edge runs along the first edge of the first feature, the second edge overlying said adjacent area and being laterally spaced from the first edge of the first feature, the first edge of the first feature being positioned between the first and second edges of the second feature in top view, wherein in top view the second feature has a narrower portion and a wider portion laterally adjacent to the narrower portion, wherein in top view the first and second edges of the second feature provide lateral boundary edges to each of the wider and narrower portions, wherein in top view the distance between the first and second edges of the second feature is smaller in the narrower portion than in the wider portion, at least a part of the wider portion overlying the first feature and the first edge;
   a dielectric overlying the second feature and having an opening over the wider portion of the second feature;
   a third feature overlying the dielectric and electrically contacting the second feature through the opening.

2. The integrated circuit of claim 1 wherein the second edge is at a predetermined distance from the first edge of the first feature.

3. The integrated circuit of claim 1 wherein the first feature is a select gate line of a nonvolatile memory array, and the second feature is a control gate line of the memory array.

4. The integrated circuit of claim 1 wherein the first feature is a conductive feature insulated from the second feature.

5. The integrated circuit of claim 3 wherein the select gate line and the control gate line extend in a predefined direction throughout the array.

6. The integrated circuit of claim 5 wherein the predefined direction is a row direction.

7. The integrated circuit of claim 5 wherein:
   a first part of the first edge of the first feature follows a first straight line but a second part of the first edge of the first feature deviates from the first straight line at a location of the wider portion;
   a first part of the second edge follows a second straight line parallel to the first part of the first edge of the first feature, but a second part of the second edge deviates from the second straight line at the wider portion, the second part of the second edge running along the second part of the first edge of the first feature.

8. The integrated circuit of claim 7 wherein the second edge has substantially the same contour as the first edge of the first feature.

9. The integrated circuit of claim 2 wherein:
   a first part of the first edge of the first feature follows a first straight line but a second part of the first edge of the first feature deviates from the first straight line at a location of the wider portion;
   a first part of the second edge follows a second straight line parallel to the first part of the first edge of the first feature, but a second part of the second edge deviates from the second straight line at the wider portion, the second part of the second edge running along the second part of the first edge of the first feature.

10. The integrated circuit of claim 2 wherein the second edge has substantially the same contour as the first edge of the first feature.

11. The integrated circuit of claim 1 wherein the first feature is a conductive feature, and a bottom surface of the second feature under the second edge is lower than the first edge of the first feature.

12. The integrated circuit of claim 11 wherein the second edge is higher than the first edge of the first feature.

13. The integrated circuit of claim 1 wherein in top view the opening is spaced from the first and second edges of the second feature to be entirely inside the wider portion.

14. The integrated circuit of claim 1 wherein the wider portion and the opening are located over a field isolation region, and the narrower portion is at least partially located over an active area.

15. The integrated circuit of claim 3 wherein the control gate line provides control gates to one or more of the memory cells, the control gates not being part of the wider portion.

16. The integrated circuit of claim 3 wherein the wider portion is located over a field isolation region, and the control gate line provides control gates to the one or more memory cells, the control gates being located over active areas of the one or more of the memory cells.

17. The integrated circuit of claim 1 wherein the first feature has a second edge opposite to the first edge and not overlaid by the second feature.

18. An integrated circuit comprising:
   a select gate line overlying a semiconductor substrate and providing select gates for a plurality of nonvolatile memory cells;
   a control gate line overlying the semiconductor substrate and having a portion overlying the select gate line, wherein in top view the control gate line has an edge which is laterally spaced from the select gate line but runs along the select gate line;

wherein in top view the control gate line has a first portion and a widened portion laterally adjacent to the first portion, the widened portion overlying the select gate line and extending laterally beyond the select gate line;

wherein the integrated circuit further comprises:

a dielectric overlying the control gate line and having an opening over the widened portion;

a conductive feature overlying the dielectric and electrically contacting the widened portion through the opening;

wherein the edge of the control gate line comprises a first part which in top view is a straight line parallel to an edge of the select gate, and comprises a second part which is an edge of the widened portion, the second part deviating from a straight line;

wherein the first and second parts of the edge of the control gate are at a predetermined distance from the edge of the select gate.

19. The integrated circuit of claim 18 wherein the opening is located over a field isolation region, and the first portion is at least partially located over active areas of one or more of the memory cells.

20. The integrated circuit of claim 18 wherein the first portion provides control gates to one or more of the memory cells.

21. The integrated circuit of claim 20 wherein the widened portion is located over a field isolation region of the semiconductor substrate, and the control gates are located over active areas of the one or more of the memory cells, the active areas being part of the semiconductor substrate.

22. The integrated circuit of claim 18 wherein the select gate line has a portion not overlaid by the control gate line and extending a whole length of the select gate line.

23. An integrated circuit comprising:

a first conductive line overlying a semiconductor substrate;

a second conductive line overlying the semiconductor substrate and having a portion overlying the first conductive line and extending along the first conductive line, the second conductive line being insulated from the first conductive line, wherein in top view the second conductive line has an edge which is laterally spaced from the first conductive line but runs along the first conductive line;

wherein in top view the second conductive line has a first portion and a widened portion laterally adjacent to the first portion, the widened portion overlying the first conductive line and extending laterally beyond the first conductive line;

wherein the integrated circuit further comprises:

a dielectric overlying the second conductive line and having an opening over the widened portion;

a conductive feature overlying the dielectric and electrically contacting the widened portion through the opening;

wherein the edge of the second conductive line comprises a first part which in top view is a straight line parallel to an edge of the first conductive line, and comprises a second part which is an edge of the widened portion, the second part deviating from a straight line;

wherein the first and second parts of the edge of the second conductive line are at a predetermined distance from the edge of the first conductive line.

24. The integrated circuit of claim 23 wherein the first conductive line has a portion not overlaid by the second conductive line and extending a whole length of the first conductive line.

* * * * *